US007463040B2

(12) United States Patent
Qi et al.

(10) Patent No.: US 7,463,040 B2
(45) Date of Patent: Dec. 9, 2008

(54) MULTIFUNCTIONAL CONDUCTING POLYMER STRUCTURES

(75) Inventors: Baohua Qi, Albuquerque, NM (US); Benjamin R. Mattes, Santa Fe, NM (US)

(73) Assignee: Santa Fe Science and Technology, Inc., Santa Fe, NM (US)

( * ) Notice: Subject to any disclaimer, the term of this patent is extended or adjusted under 35 U.S.C. 154(b) by 476 days.

(21) Appl. No.: 10/910,169

(22) Filed: Aug. 2, 2004

(65) Prior Publication Data

US 2005/0062486 A1 Mar. 24, 2005

Related U.S. Application Data

(60) Provisional application No. 60/491,885, filed on Aug. 1, 2003.

(51) Int. Cl.
*G01R 27/08* (2006.01)

(52) U.S. Cl. ........................ 324/693; 324/694; 324/696

(58) Field of Classification Search ................. 324/693, 324/694, 696

See application file for complete search history.

(56) References Cited

U.S. PATENT DOCUMENTS 5,171,478 A 12/1992 Han
5,422,462 A 6/1995 Kishimoto
6,229,318 B1 * 5/2001 Suda .......................... 324/694
2004/0189331 A1 * 9/2004 Girshovich et al. ......... 324/694

FOREIGN PATENT DOCUMENTS

WO WO 99/24991 5/1999
WO WO 2004/051672 6/2004

OTHER PUBLICATIONS

PCT International Search Report.

* cited by examiner

*Primary Examiner*—Timothy J Dole
(74) *Attorney, Agent, or Firm*—Samuel M. Freund; Cochran Freund & Young LLC

(57) ABSTRACT

The present invention includes the use of conducting polymers as sensors in distributed sensing systems, as sensors and operating elements in multifunctional devices, and for conducting-polymer based multifunctional sensing fabrics suitable for monitoring humidity, breath, heart rate, blood (location of wounds), blood pressure, skin temperature, weight and movement, in a wearable, electronic embedded sensor system, as examples. A fabric comprising conducting polyaniline fibers that can be used to distribute energy for resistive heating as well as for sensing the fabric temperature is described as an example of a multifunctional sensing fabric.

9 Claims, 20 Drawing Sheets

New Fig. 9b

MULTIFUNCTIONAL CONDUCTING POLYMER STRUCTURES

RELATED CASES

The present application claims the benefit of Provisional Patent Application Ser. No. 60/491,885, for "Multifunctional Conducting Polymer Structures" filed on Aug. 01, 2003, the teachings of with are hereby incorporated by reference herein.

STATEMENT REGARDING FEDERAL RIGHTS

This invention was made with government support under Contract No. MDA972-99-C-0004 awarded by the U. S. Defense Advance Research Projects Agency to Santa Fe Science and Technology, Inc., Santa Fe, N.Mex. 87507. The government has certain rights in the invention.

FIELD OF THE INVENTION

The present invention relates generally to conducting polymer devices and, more particularly, to the use of conducting polymer structures as multifunctional devices and distributed sensors.

BACKGROUND OF THE INVENTION

The many types and forms of textile materials have one thing in common: almost all such fabrics are passive, and do not respond or interact by active human control with the environment into which they are placed. Typically, technical textiles are prepared from low volume, high value specialty synthetic fibers, while wearable (fashion) textiles are prepared from high volume low value natural or synthetic fibers. If electronic function could be integrated with technical or wearable textiles, then a new generation of devices would be possible. However, suitable conducting and semi-conducting textile fibers are scarce. There is therefore, a need for fibers that conduct electricity like a metal or an inorganic semiconductor, while simultaneously being compatible with conventional textile processing equipment. Such fiber must be mechanically strong and flexible, yet also be environmentally stable throughout the lifetime of the fabric.

Multifunctional electronic fabrics (Smart Fabrics and Interactive Textiles) can potentially revolutionize the way in which people interact with their daily environment. However, electronic devices would have to be brought into close proximity to the human body. Environmental stimuli (data) would be sensed or detected and collected through a variety of sensors at different locations of the fabric. The data collected from the body (or environment) would then be sent to a signal-processing unit (controller) for interpretation and, after a controlled response is achieved, information would be sent to other areas of the fabric (or an external device) to achieve a desired outcome from a functional device.

Organic semiconductors, variously called π-conjugated polymers, conducting polymers, or synthetic metals, are inherently semi-conductive due to π-conjugation between carbon atoms along the polymer backbone. Their structure contains a one-dimensional organic backbone based on the alternation of single and double bonds, which enables electrical conduction following $n^-$ or $p^+$ type doping. Such materials offer advantages for sensor technologies, including the ability to tailor structure and properties, relatively low cost, and simple fabrication techniques; for example, they can be coated onto various types of substrates. These materials also have properties traditionally associated with other inorganic materials, including light absorption and emission; electrical conductivity; humidity, temperature, and pressure sensitivity; and electrochromic behavior. Unlike other conductive fiber materials that have been successfully woven by textile manufacturing equipment, such as metal wire (heavy, fabric, not washable), carbon or metal-filled plastic fiber (mechanical properties degrade with increased loading), graphite fiber (too stiff and brittle), and piezoelectric fiber (poorly conducting), conducting polymer fibers such as polyaniline are strong (strength modulus 2-6 GPa, tenacity 80-300 MPa), light weight (1.5 g/cm$^3$), flexible (between 3% and 20% elongation), and highly conductive (300-1000 S/cm), making them suitable for weaving, knitting, stitching, and braiding.

Accordingly, it is an object of the present invention to provide wearable electronic textiles containing embedded wired, wireless and/or hybrid sensors, and distributed sensor networks (DSN) for sensing humidity, temperature, applied load (stress) and dimensional changes (strain), as examples.

Another object of the present invention is to provide sensor and DSN fabric for monitoring breathing rate, heart rate, blood emission (wound location), blood pressure, humidity, weight, movement, and skin temperature (for predicting the onset of hyperthermia and hypothermia).

Yet another object of the invention is to provide fabric having multifunctional capability.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention as embodied and broadly described herein, the multifunctional device hereof includes: a conducting polymer element having a physical property the value of which is responsive to a condition to which the element is exposed, the element being capable of conducting electrical signals and/or changing the condition in response to a stimulus external to the element; means for measuring the value of the physical property and for generating a signal in response thereto; and means for receiving the signal from the measuring means and for maintaining the condition at a chosen value or changing the condition by generating a stimulus effective for changing the condition and applying the stimulus to the element.

In another aspect of the present invention and in accordance with its objects and purposes, the apparatus for heating hereof includes: (a) at least one conducting polymer fiber; (b) means for applying electric current to the at least one conducting polymer fiber; and (c) means for measuring the resistance of the at least one polymer fiber, such that the fiber temperature can be determined.

In yet another aspect of the present invention and in accordance with its objects and purposes, the apparatus for providing humidity hereof, includes: (a) at least one conducting polymer fiber; (b) means for applying electric current to the at least one conducting polymer fiber effective for controlling the amount of water absorbed thereon; and (c) means for measuring the resistance of the at least one polymer fiber, such that the relative humidity to which the fiber is exposed can be determined.

In yet a further aspect of the present invention and in accordance with its objects and purposes, the method for heating hereof includes the steps of: (a) applying electric current to at least one conducting polymer fiber; and (b) measuring the resistance of the at least one polymer fiber, such that the temperature of the fiber can be determined.

In still another aspect of the present invention and in accordance with its objects and purposes, the method for providing humidity hereof includes the steps of: (a) applying electric current to at least one conducting polymer fiber effective for controlling the amount of water absorbed thereon; and (b) measuring the resistance of the at least one polymer fiber, such that the relative humidity to which the fiber is exposed can be determined.

Benefits and advantages of the multifunction device of the present invention include light weight, compact design, the capability of large area sensing, and massive redundancy of the sensor system which leads to improved reliability; that is, conducting polymer fibers function both as sensors and as conductors (wires), which enables area sensing since the entire fiber (or fabric) functions as a sensor. Area sensing gives rise to the redundant nature since, if a portion of a sensor system (fabric) fails, other parts of the system may still be able to acquire the required information and perform the function.

BRIEF DESCRIPTION OF THE DRAWINGS

The accompanying drawings, which are incorporated in and form a part of the specification, illustrate several embodiments of the present invention and, together with the description, serve to explain the principles of the invention. In the drawings:

FIG. 4*a* is a graph of the resistance as a function of time for an overloading voltage (4.5V) applied to a polyaniline fiber having a length of 12.0 mm and a diameter 95 μm, while

FIG. 7*a* shows the percent change of resistance of the polyaniline monofilament knitted into the fabric shown in FIG. 6 hereof as a function of the percent extension of the fabric, while

FIGS. 9*a*-9*c* show schematic representations of several embodiments of apparatus for sensing changes in shape; while

FIG. 10*a* shows a schematic representation of a touch sensor embodiment of the present invention, while

DETAILED DESCRIPTION

Figure 1:
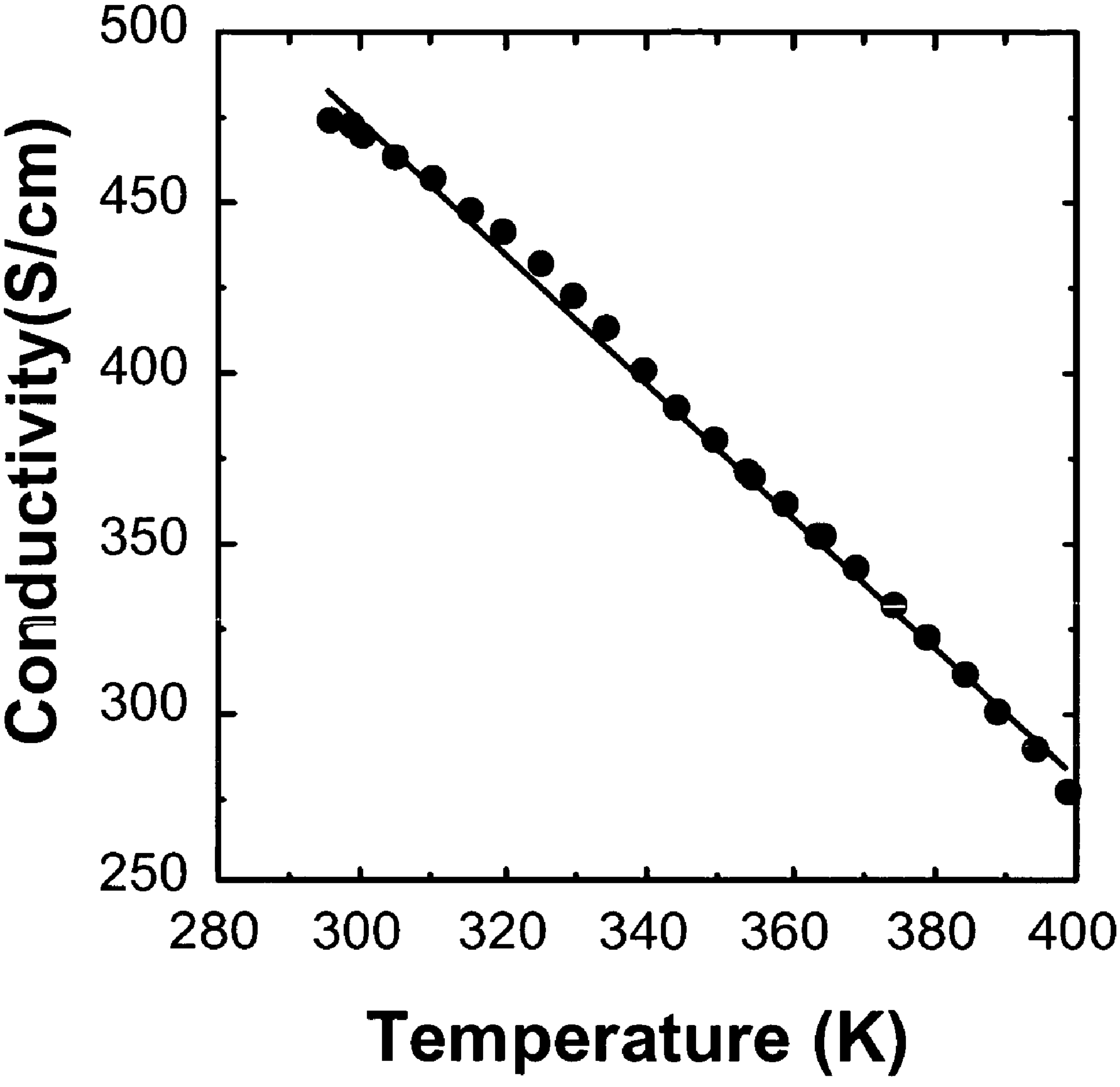
FIG. 1 is a graph of the DC conductivity for a polyaniline fiber as a function of temperature.

Wearable interfaces between electronic devices and people are achieved using Smart Fabrics and Interactive Textiles (SFIT), where functional devices are embedded into wearable garments. A SFIT device, as used herein, includes the following: (a) a fabric that contains electrically conductive polymer fiber (or yarn) interlaced (by weaving, knitting, stitching, or braiding) with a non-conductive structural fiber (or yarn) that is capable of relaying electrical signals from one location of the fabric to another; (b) a data acquisition or sensing element (DAE) that processes changes in electrical signals from the conductive fiber elements of the fabric; and (c) a controller that receives input from the sensing elements, and generates an electrical output directed to functional devices in a controlled fashion (set points), as collected from the DAE, to achieve the desired outcome. Additional microelectronic hardware may be incorporated for data transmission; for example, radiofrequency transmission via Bluetooth or WIFI, and reception (computer) for data processing. Due to their multifunctional design, SFIT fabrics are wearable devices that are flexible and comfortable to wear.

Both the monitoring of body kinematics and health (including vital signs detection), would benefit from the implementation of wearable sensorized systems. In particular, garments with strain and stress sensing capabilities would enable the tracking and accurate determination of kinematic variables such as walking, jumping, and landing, as examples. The integration into skin-adherent clothes of several kinds of biosensors for health monitoring would permit daily health promotion and disease prevention through a continuous, personalized and self-detection of vital signs and physiological variables.

Besides sensors, the comfortable embedding into textile substrates of smart actuators represents a further potentially useful tool for rehabilitation. Actuators may provide mechanical support and motion for lost or impaired motor functions for physiotherapeutic restoration. These actions could be performed either by following predefined tasks or by exploiting the strain and stress information produced by co-integrated sensors. The active support offered by wearable actuators could also improve sports training techniques or prevent risks related to abnormal stress distributions and overloading.

Sensors and actuators used in textiles may be electrically powered and controlled by power and electronic devices also advantageously embedded in the fabrics. The integration of active electronic components would enable the implementation of closed-loop controls for the system. Furthermore, the possibility of simultaneously monitoring a set of physiological signals and variables and processing and transmitting data offers a capability to support health professionals for remote assistance. Home care of sick or elderly persons, or treatment of individuals in extreme conditions such as soldiers or astronauts, are examples of possible fields of application.

Wearable multifunctional textiles may be useful for wearable wireless communication systems (integration into clothes of resources for the transmission of information; that is, earphones, microphones or entire mobile phones); personnel telecontrol (for example, localization and tracking of persons through local networks or the global positioning system (GPS)), tele-assistance (for example, embedding accidental fall sensors for elders and automatic help request sensors into garments); ergonomics (for example, integration of devices for comfort and safety); and virtual-augmented reality (for example, simulation wearable systems for professional training and interactive entertainment).

As examples of the above applications, the present invention includes the use of conducting polymers as sensors in distributed sensing systems, as sensors and operating elements in multifunctional devices, and conducting-polymer based multifunctional sensing fabrics suitable for monitoring humidity, breath, heart rate, blood emission (location of wounds), blood pressure, skin temperature, weight and movement, in a wearable, electronic sensor system, as examples. The use of conducting polymers for such sensing functions, in addition to actuation, computation and electrical energy generation/storage offers advantages passive properties in terms of mechanical flexibility and ease of processing, as well as superiority over inorganic materials used for such functions.

There are many ways to layout multi-functionality in the textile format. For certain applications a fabric or a braided structure may consist entirely of the conducting polymer fiber (See, e.g., FIGS. 6*a* and 6*b*, where 2-D braided tape or 3-D tubular braid are respectively shown). In other instances and applications, it may be desired to co-mingle the conducting polymer fiber (or yarn) with non-conducting fiber structural or insulating elements (See, e.g., FIG. 6*a*, where a conducting polyaniline thread is co-knitted with an insulating Nylon yarn.). In any case, those skilled in the art will recognize that the primary methods for creating multi-functional structures include weaving, knitting, stitching, or braiding.

Woven structures can be divided into two principal categories: simple structures and compound structures. In simple structures, the ends (warp) and the picks (weft) intersect one another at right angles and in the fabric are respectively parallel with each other. In such constructions, there is only one series of ends and one series of picks, and all threads are equally responsible for both the utility (performance) of a fabric and its aesthetic appeal. Compound structures may have more than one series of ends or picks, some of which may be responsible for the "body" of the fabric, such as ground yarns, while others may be employed entirely for ornamental purposes such as "figuring" or "face" yarns. Pile surface constructions have some threads projecting out at right angles to the general plane of the fabric.

There are three types of weaves: plain, twill and satin. All variations may include elements of one or more basic weaves in each cloth. In a plain weave, the threads are interlaced in alternate order, and if the warp and weft threads are similar in thickness and number per unit space, the two series of threads bend about equally. The twill order of interlacing causes diagonal lines to be formed in the cloth. These weaves are employed for the purpose of ornamentation and to enable a cloth of greater weight, close setting, and better draping quality to be formed than can be produced using similar yarns in plain weave. The surface of a satin weave consists either of a weft or warp float, as in the repeat of a weave each thread of one series passes over all but one thread of the other series. Satin weaves have a high degree of smoothness and luster without any prominent weave features. The present invention includes biaxial woven, high modulus woven, multilayer woven, and triaxial woven fabric structures.

Figure 6A:
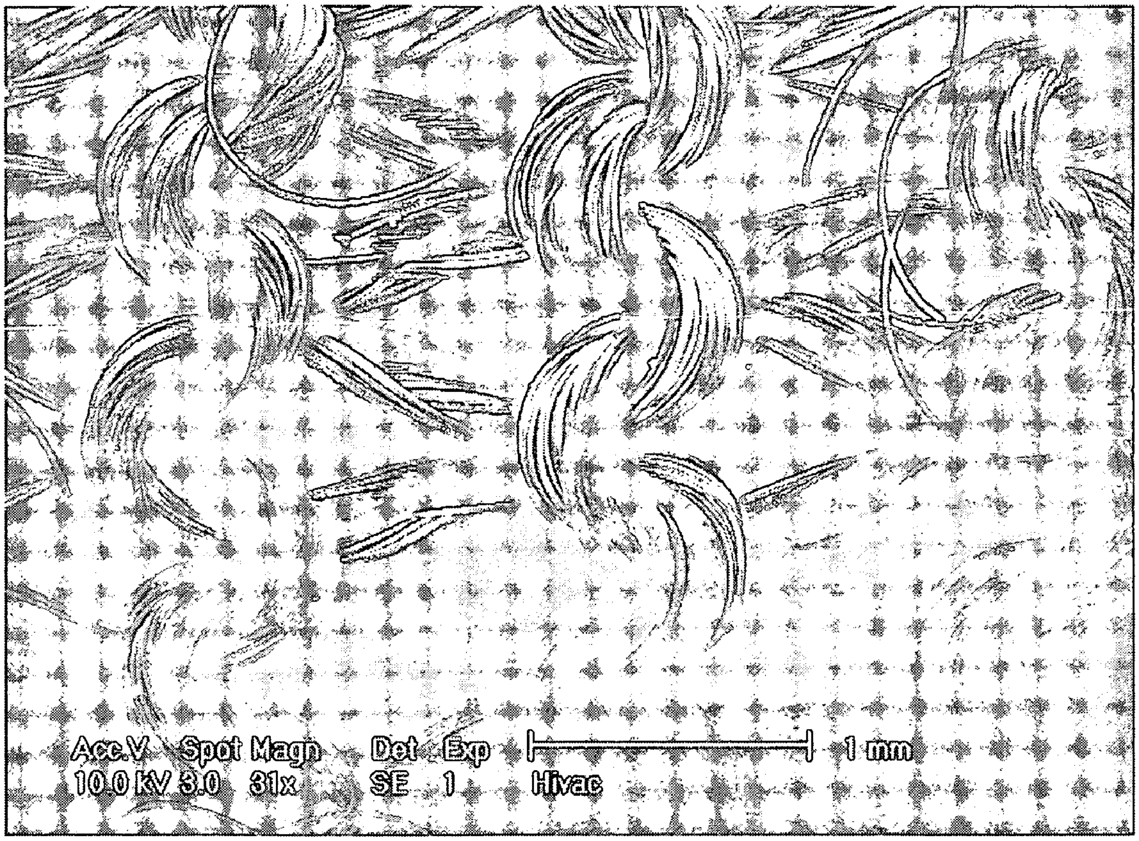
FIG. 6*a* is a photograph of a 40 denier conducting polyaniline monofilament (dark fibers) knitted into a fabric with insulating nylon yarn (light fibers)
Figure 6B:
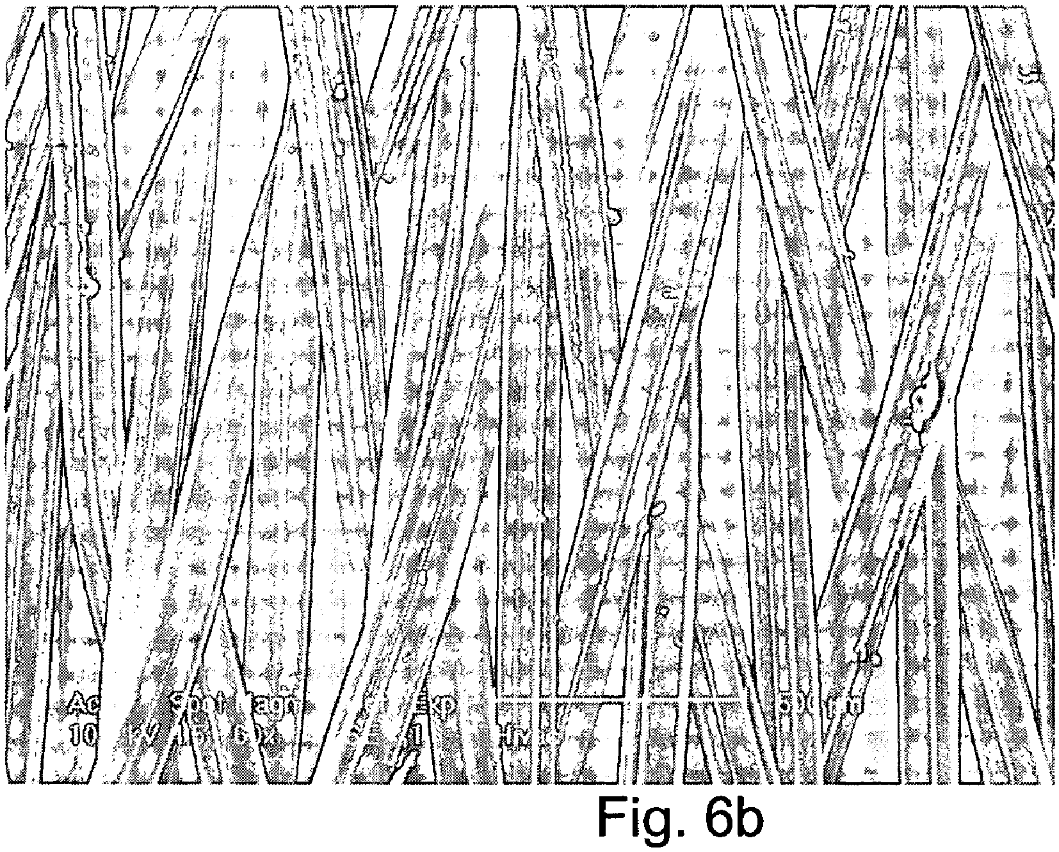
FIG. 6*b* shows 2-D tape braid composed entirely of 40 denier conducting polyaniline monofilament fibers.

Placement of conducting polymer fibers such as polyaniline to create multifunctional structures can be achieved by knitting (See FIGS. 6*a* and 6*b*). Knitting is the process of constructing a fabric by forming loops of yarn with needles and drawing other new loops through those previously formed, and includes the process of making a fabric on more than one needle by interloping a thread (or yarn) or several parallel threads (or yarns). There are two categories into which all specific types fall: warp knitting and weft knitting. Warp knitting has two basic types: Tricot and Raschel. Weft knitting has four basic knit structures: plain, rib, purl, and interlock. Other embodiments of the present invention include: weft knit, warp knit, weft knit laid in weft, weft knit laid in warp, weft knit laid in weft and warp, weft inserted warp knit, weft inserted warp knit laid in warp, multifunctional structures.

Placement of conducting polymer fibers such as polyaniline to create multifunctional structures can be achieved by stitching. Stitching is a method for interlacing two (or many) separate textile parts together. Stitching allows for accurate placement of interconnects, for creating superficial circuits from conducting polymer thread, and for attaching electronic components to textile surfaces. If stitching large areas or three-dimensional complex-shaped structures are desired, then one-side stitching techniques may be successfully utilized. Since the work piece can be accessed from one side only, stitching of complicated structures is not limited by the design or the size of the stitching machine.

A wide range of stitch geometries are possible at various stitch densities. Besides the conventional double-lock stitch, two different techniques for one-side stitching are available. The two-needle one-side simple chain stitching head produces a double-line seam; the work piece is penetrated by the stitching thread at different inserting angles. Where local reinforcement or localized interconnects are needed, a tufting head can be used which allows insertion of the stitching thread at various angles and under the lowest possible thread tensions.

Figure 6C:
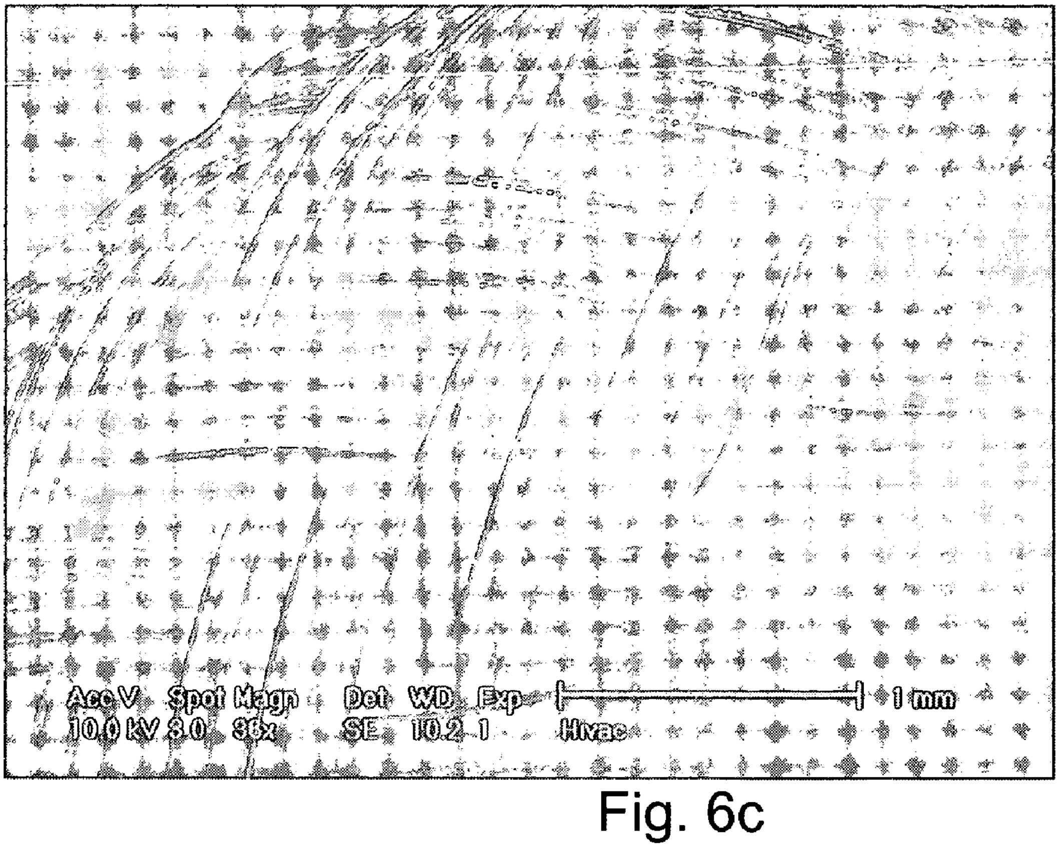
FIG. 6*c* shows a tubular braid of 40 denier conducting monofilament polyaniline fiber.

Placement of conducting polymer fibers such as polyaniline to create multifunctional structures can be achieved by braiding. Braided structures are intertwined fiber assemblies known for their torsional stability, high level of formability, and net shape capability. Braided structures can assume a linear geometry or a 2-D planar geometry, as in tapes (FIG. 6*b*), and 3-D body of revolution including tubular structure (FIG. 6*c*) or solid net-shape structures. Thus braided structures are ideal for energy transmitters such as cable or motion generators, as in linear 2-D and 3-D actuators, as well as for composite stiffening members for antenna disk or multi-layer interconnects. Other embodiments of the present invention include: tubular braid, tubular braid laid in warp, flat braid, flat braid laid in warp, square braid, square braid laid in warp, 3D braid, and 3-D braid laid in warp.

Textile structures having different functions may have woven, stitched or braided conducting polymer fibers strategically placed throughout the fabric. A connector bus is used for internal communication among the functional fabrics, and for the data link between the embedded sensor system and a central computer. Such a structure has the advantage of being readily upgraded or changed by changing the functional fabrics, while not decreasing the reliability of the system.

As an example, a fabric comprising conducting polyaniline fibers can be used to distribute energy for resistive heating as well as for sensing the fabric temperature. An additional advantage of such a polyaniline fiber structure is that when too high a voltage or current is applied to the fibers, it has been found that the fibers lose their conductivity between 40° C. and 60° C., much below the decomposition temperature of the fibers (between about 150° C. and 250° C.); therefore, if the temperature control system fails, the heating fabric will not burn the skin.

Although polyaniline used for practice of the present invention was produced from polymerization of unsubstituted aniline, the term polyaniline as used herein includes the following polyanilines which are expected to perform in a similar manner. Polyanilines suitable for use in accordance with the present invention are homopolymers and copolymers derived from the polymerization of unsubstituted or substituted anilines of the form:

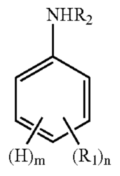

where n is an integer between 0 and 2; m is an integer between 3 and 5, such that n+m=5; $R_1$ is selected so as to be the same or different at each occurrence and is selected from the group consisting of aryl-, alkyl-, alkenyl-, alkylthio- and alkoxy- moieties having between 1 and about 30 carbon atoms, cyano-, halo-, acid functional groups, such as those from sulfonic acid, carboxylic acid, phosphonic acid, phosphoric acid, phosphinic acid, boric acid, sulfinic acid and derivatives thereof, such as salts, esters, and the like; amino-, alkylamino-, dialkylamino-, arylamino-, hydroxyl-, diarylamino-, and alkylarylamino- moieties; or alkyl, aryl, alkenyl, alkylthio or alkoxy substituted with one or more acid functional groups, such as sulfonic acid, carboxylic acid, phosphonic acid, phosphoric acid, phosphinic acid, boric acid, sulfinic acid and derivatives thereof, such as salts, esters, and the like. $R_2$ is the same or different at each occurrence and, is either one of the $R_1$ substituents or hydrogen.

Polyanilines suitable for use in this invention are generally those which include the following repeat units or a combination thereof having various ratios of these repeat units in the polyaniline backbone:

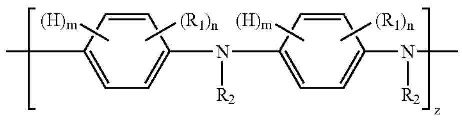

and reduced repeat unit

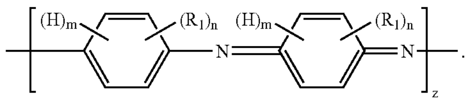

oxidized repeat unit

As an example:

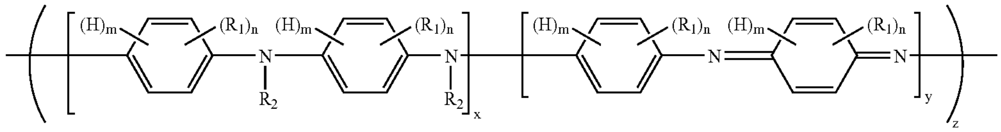

where x represents that fraction of the reduced repeat units in the polymer backbone and 7 represents at fraction of the oxidized repeat units in the polymer backbone, such that x+y=1; and z is an integer equal to or greater than about 20. For the polymer in its emeraldine base oxidation state, x=0.5 and y=0.5.

I. Preparation of Conducting Polymer Fibers:

The conducting polymer fibers and fabrics used to illustrate the present invention were prepared as follows:

A. Synthesis Of High Molecular-Weight Polyaniline:

Water (6,470 g) was first added to a 50 L jacketed reaction vessel fitted with a mechanical stirrer. Phosphoric acid (15, 530 g) was then added to the water, with stirring, to give a 60 mass % phosphoric acid solution. Aniline (1,071 g, 11.5 moles) was added to the reaction vessel over a 1 h period. The stirred aniline phosphate was then cooled to −35.0° C. by passing a cooled 50/50 by mass, methanol/water mixture through the vessel jacket. Ammonium persulfate oxidant (3,280 g, 14.37 moles) was first dissolved in water (5,920 g), and the resulting solution was added to the cooled, stirred reaction mixture at a constant rate over a 30 h period. The temperature of the reaction mixture was maintained at −35.0±1.5° C. during the duration of the reaction.

The reactants were typically permitted to react for 46 h, after which the polyaniline precipitate was filtered from the reaction mixture and washed with about 25 L of water. The wet polyaniline filter cake was then mixed with a solution of 800 mL of 28% ammonium hydroxide solution mixed with 20 L of water and stirred for 1 h, after which the pH of the suspension was measured to be 9.4, to convert the as-synthesized polyaniline from its conductive, emeraldine salt oxidation state to its emeraldine base oxidation state (PANI-EB).

The polyaniline slurry was then filtered and the polyaniline filtrate washed 4 times with 10 L of water per wash, followed by a washing with 2 L of isopropanol. The resulting polyaniline filter cake was placed in plastic trays and dried in an oven at 35° C. until the water content was below 5 mass %. The recovered mass of dried polyaniline emeraldine base was 974 g (10.7 moles) corresponding to a yield of 93.4%. The dried powder was sealed in a plastic bag and stored in a freezer at −18° C. The weight average molecular weight ($M_w$) of the powder was determined to be 280,000 g·mol$^{-1}$, although $M_w$ values between about 100,000 and about 350,000 g·mol$^{-1}$ have been obtained using this synthesis by controlling the reaction temperature between 0 and −35° C., respectively. Gel permeating chromatograph molecular weight data was obtained using a 0.02 mass % solution of EB in NMP containing 0.02 mass % lithium tetrafluoroborate. The flow rate of the solution was 1 mL·min.$^{-1}$, and the column temperature was 60° C. The Waters HR5E column utilized was calibrated using Polymer Labs PS1 polystyrene standards.

All reported solutions were made using PANI-EB having a weight average molecular weight ($M_w$) of about 300,000 g·mol$^{-1}$. However, fibers have been successfully produced using polyaniline having weight average molecular weights between about 90,000 and about 350,000 g·mol$^{-1}$ (defined as high molecular weight polyaniline herein). The use of higher molecular weight polyaniline enables the fibers to survive greater stretch ratios in the spin line without breaking. High stretch ratios are important for obtaining fibers having high electrical conductivity, high modulus and high peak stress.

B. Fiber Spinning of Spin Solutions Having 6 Mass % PANI.AMPSA$_{0.6}$ in DCAA:

Polyaniline emeraldine base (84.2 g, 0.93 moles of aniline repeat units) and 2-acrylamido-2-methyl-1-propanesulfonic acid (AMPSA, 115.8 g, 0.56 moles) were added to a 2 L plastic vessel containing a ceramic grinding media. The contents were milled for 2 h, and 1.0 g of water was added to the vessel contents 30 min. after the milling process was commenced. Dichloroacetic acid (DCM, 940 g) was placed in a vessel that was maintained at a temperature between 10 and 15° C.

A Silverson SL4RT mixer having a duplex head was immersed in the DCM and stirred at 1500-2000 rpm. PANI.AMPSA$_{0.6}$ powder (60 g) was added with stirring to the DCAA over a 3 h period to produce 1 kg of a 6 mass % solution. The temperature of the stirred solution was kept below 35° C. at all times to prevent gelling. After the powder addition, the solution was further mixed for 18 h before being degassed under a dynamic vacuum of ~50 mbar for 1 h.

The degassed solution was placed inside of a pressure vessel and 20 psi of nitrogen gas pressure was applied to the vessel to direct the solution to a gear pump. The solution was passed through a 230 μm pore filter prior to entering the gear pump, (Mahr & Feinpruf) which included 2 interlocking cogs which deliver 0.08 cm$^3$ of solution per revolution. The gear pump was adjusted to deliver the spin solution at a rate of 1.3 cm$^3$·min.$^-$. The solution was then passed through 230 and 140 μm pore filters before entering a 250 μm diameter spinneret (I/d=4). The spinneret was immersed in an ethyl acetate coagulation bath (wet spinning), and the nascent fiber was passed through the coagulation bath for about 1 m before being taken up on a pair of rotating (12.0 rpm; 6.2 m·min.$^{-1}$.), 16.5 cm diameter godet drums immersed in a 1 M solution of phosphoric acid.

The fiber was then passed through a 1.2 m long heat tube maintained at a temperature of 90±10° C. and wound onto a second godet pair having the same diameter and the first pair, and turning at 15.6 rpm (8.1 m·min.$^{-1}$), thereby stretching the fiber with a 1.3:1 stretch ratio. The fiber was then collected on a 15 cm diameter bobbin turning at 18 rpm (8.5 m·min.$^{-1}$) and allowed to dry at ambient conditions for several weeks. About one month later, a section of the fiber was measured and found to have a diameter of 56±2 μm, a conductivity of 270±30 S·cm$^{-1}$, a peak stress of 108±9 MPa, a modulus of 4.1±0.3 GPa, and an extension at break of 20±4%.

C. Fiber Spinning of Spin Solutions Having >6 Mass % PANI.AMPSA$_{0.6}$ in DCAA:

Solutions having between 7 and 14 mass % PANI.AMPSA$_{0.6}$ in DCM were prepared on the 1 kg scale in accordance with the procedure set forth hereinbelow. The PANI-EB powder was dried to achieve the desired individual residual water contents listed in TABLE 1 under ambient conditions or using a vacuum oven at approximately 60° C. The water content of the PANI-EB powder was determined by thermogravimetric analysis (TGA). If the mass % of water in the PANI-EB powder was found to be lower than the chosen amount, additional deionized water was added to the powder prior to preparing the spin solution to achieve the chosen water content. The percentage water in the spinning solutions was between 0.1 and 0.6 mass %, which corresponds to a water content in the polyaniline of between 2 and 12 mass %.

Solution A was prepared by first dissolving ½ of the AMPSA (17.4 g) in the DCM solvent. The remaining AMPSA (17.4 g) was then ground with the PANI-EB powder forming a PANI/AMPSA powder mixture, and added to the DCM solution in discrete portions with mixing over a 7 h period. Solutions B, C and D were prepared by dissolving all of the AMPSA in the DCAA, and adding the PANI-EB powder to the DCAA solution in discrete portions with mixing over a 5-7 h period. The total mixing time for each of these solutions is also listed in TABLE 1 which provides a summary of compositions for PANI.AMPSA solutions dissolved in DCM. Other solutions, not reported here, were prepared by combining the PANI-EB and AMPSA powders using a ball mill and added to the DCAA in discrete portions. The final solution properties have been found to be independent of the method for powder addition, so long as the rate of powder addition of each portion was chosen to maintain the solution temperature below 35° C. (to avoid gelation).

As the solutions become more concentrated, the viscosity thereof increases. This results in additional heat being generated by viscous dissipation; therefore, the temperature of the mixing solutions was continuously monitored to ensure that the solution temperature did not exceed 35° C. Entrapped air resulting from the mixing process was removed by degassing the solutions under vacuum at 50 mbar for 1 h before use.

TABLE 1

| Label | Solids Content (mass %) | Scale (g) | % water in PANI-EB (mass %) | PANI (g) | AMPSA (g) | DCAA (g) | % water in solution (mass %) | Total mixing time (h) | Max. temp (° C.) |
|---|---|---|---|---|---|---|---|---|---|
| A | 12 | 500 | 10 | 27.4 | 34.8 | 437.2 | 0.5 | 11.5 | 28 |
| B | 12 | 500 | 10 | 27.4 | 34.8 | 437.2 | 0.5 | 12.5 | 33 |
| C | 12 | 1,500 | 10 | 84.0 | 104.4 | 1311.6 | 0.5 | 15 | 28 |
| D | 11 | 1,000 | 4 | 46.3 | 63.7 | 890 | 0.2 | 10 | 31 |

In a representative spin using the equipment described hereinabove, with a 150 μm diameter spinneret and a pump flow rate was $0.10\ cm^3 \cdot min.^{-1}$, the residence time in the ethyl acetate bath was 77 s. The heating tube temperature was 85° C., and 18.8 g of fiber having a diameter of 86±2 μm were collected over 150 min. The speed of the first godet was 3.0 rpm (~1.56 $m \cdot min^{-1}$). The speed of rotation of the second godet was varied between 1.2 and 2.7 times faster than the first godet, in steps (3.6; 4.5; 5.4; 6.3; 7.2; and 8.1 rpm, as examples). Fiber samples were collected for several minutes at each speed for further measurements. When the stretch ratio was higher than 3.0 for these fiber processing conditions, it was found that continuous fiber spinning became difficult, suggesting that the limit of the stretch ratio for these conditions is ≦3 ($2^{nd}$ godet speed of rotation ≦9 rpm). TABLE 2 shows the variation of fiber properties with increasing amounts of stretch between the godets.

TABLE 2

| Speed ratio godet 2: godet 1 | Diameter (μm) | Denier* | Conductivity ($S \cdot cm^{-1}$) | Peak Stress (MPa) | Modulus (GPa) | Extn. at break (%) |
|---|---|---|---|---|---|---|
| 1.2 | 93 ± 2 | 103 | 335 ± 25 | 62 ± 5 | 0.6 ± 0.1 | 84 ± 8 |
| 1.5 | 84 ± 2 | 79 | 445 ± 40 | 77 ± 5 | 1.1 ± 0.1 | 60 ± 4 |
| 1.8 | 78 ± 2 | 68 | 525 ± 4 | 70 ± 8 | 1.4 ± 0.1 | 42 ± 10 |
| 2.1 | 70 ± 2 | 55 | 630 ± 65 | 79 ± 2 | 2.1 ± 0.1 | 29 ± 10 |
| 2.4 | 66 ± 2 | 48 | 750 ± 80 | 97 ± 5 | 2.6 ± 0.2 | 14 ± 4 |
| 2.7 | 62 ± 2 | 43 | 810 ± 100 | 111 ± 3 | 2.9 ± 0.4 | 12 ± 4 |

*Denier is defined as the number of grams per 9000 m of fiber.

D. Dopant Exchange of the Polyaniline Fibers

Since the performance of conducting-polymer-based devices is known to be dependent on the properties of dopant anions, for certain applications it may be desirable to replace the dopants (AMPSA and DCM, as examples), present in the polyaniline fibers as a result of the acid-spinning process, with other dopants. Dopants present in polyaniline fibers can be partially or totally replaced with selected dopants during: (a) the spinning process; (b) post-spinning dopant manipulation; and (c) fiber conversion to the insulating EB form (dedoped) as part of the spinning process, followed by redoping with a selected acid. The three approaches have been fount to generate the same electrical and mechanical properties in the doped form of the fibers. The removal of DCAA from the as-spun fiber is advantageous since residual DCM has been found to slowly degrade the mechanical properties of polyaniline fiber, and because it is a hazardous compound.

A dedoping procedure for removing dopants (AMPSA and DCM, as examples) from the as-spun fibers which results in fibers having low room-temperature conductivity is now described. Essentially all of the dopants can be removed from as-spun fiber without substantially changing the mechanical properties of the fiber, which converts the fibers from their conductive emeraldine salt oxidation state into their neutral emeraldine base oxidation state. Polyaniline fibers were dedoped by placing them in contact with a 0.1 M aqueous solution of $NH_4OH$ as either part of the spinning process or by a subsequent post-treatment process for between 15 min. and 3 h. The high volatility of ammonium hydroxide compared with sodium hydroxide permits its complete removal from the fiber. By contrast, it was found that use of sodium hydroxide results in the incorporation of sodium ions into the resulting dedoped fiber.

The dedoped polyaniline fibers could then be rendered conductive by immersing the fibers in an acidic solution having pH≦3. In a typical procedure, the dedoped polyaniline fiber was redoped by immersing the fiber in a 1.0 M solution of the desired acid for 24 h. The redoped fibers were then dried under ambient conditions for at least 48 h before being incorporated into a device.

E. Measurement of the Conductivity of the Polyaniline Fibers

Conductivity as a function of temperature, conductivity and temperatures as a function of applied constant current, and conductivity and temperature as a function of applied constant voltage were studied for doped polyaniline fiber using chromel-constantan differential thermocouples (chromel contains 90% Ni and 10% Chromium; and constantan contains 45% nickel and 55% copper).

Figure 2:
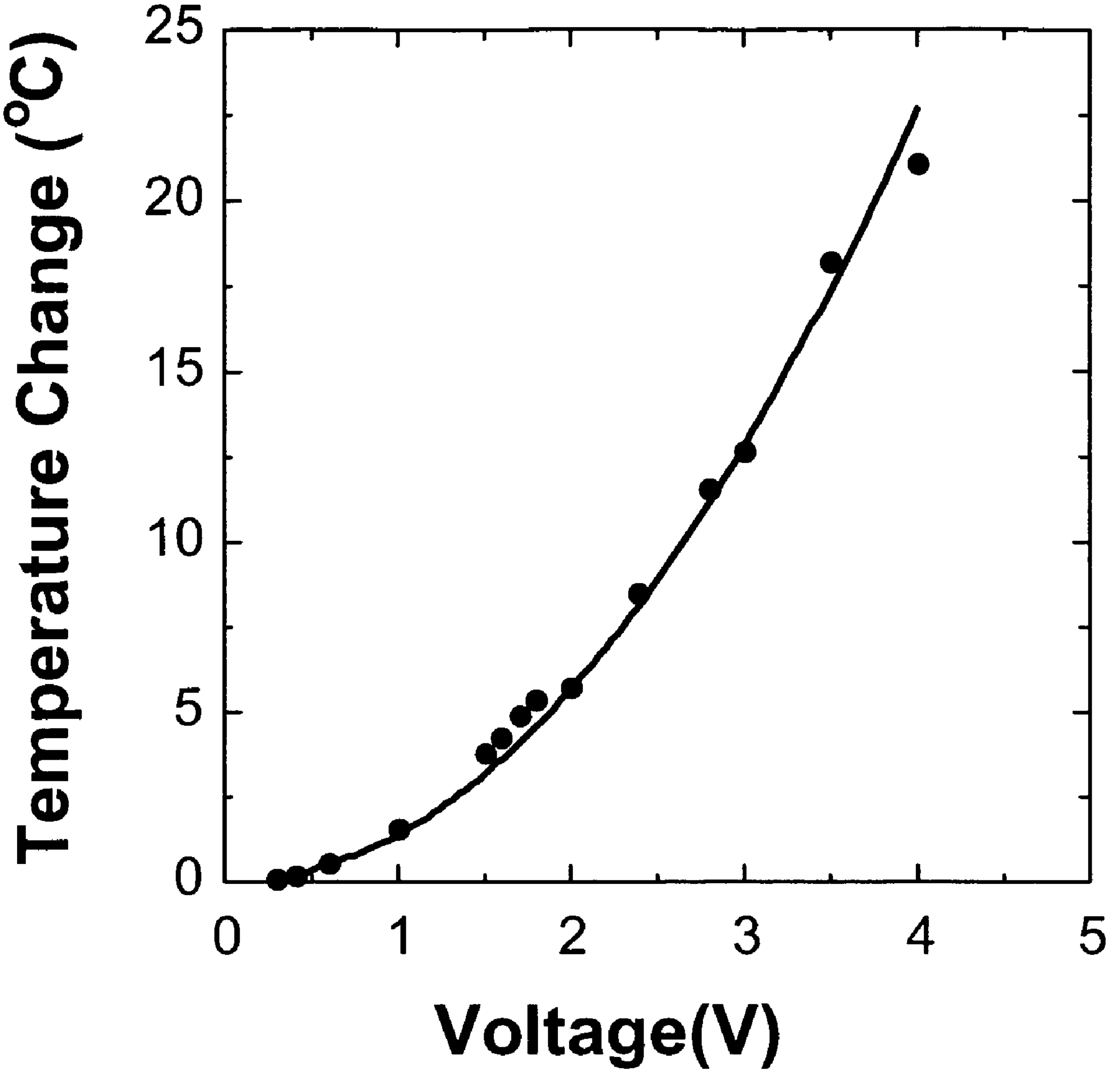
FIG. 2 is a graph of the change in temperature of a 12 mm long, 95 μm diameter polyaniline fiber resulting from resistive heating as a function of applied voltage, where the base temperature is 22.9° C.

II. Characteristics of Polvaniline fibers:

A. Temperature-dependent Conductivity of Polyaniline Fibers:

FIG. 1 is a graph of the DC conductivity for a polyaniline fiber ($PANI.AMPSA_{0.2}.\ DCAA_{0.27}.(H_3PO_4)_{0.35}$, where each of these numbers corresponds to the number of acid molecules per nitrogen atom on the polyaniline backbone) a function of temperature, while FIG. 2 shows the change of temperature of a 12 mm long, 95 μm diameter polyaniline fiber resulting from resistive heating as a function of applied voltage, where the base temperature is 22.9° C. Thermogravimetric analysis of this polyaniline fiber indicates that the onset of thermal decomposition occurs when the temperature exceeds 180° C.

Figure 3:
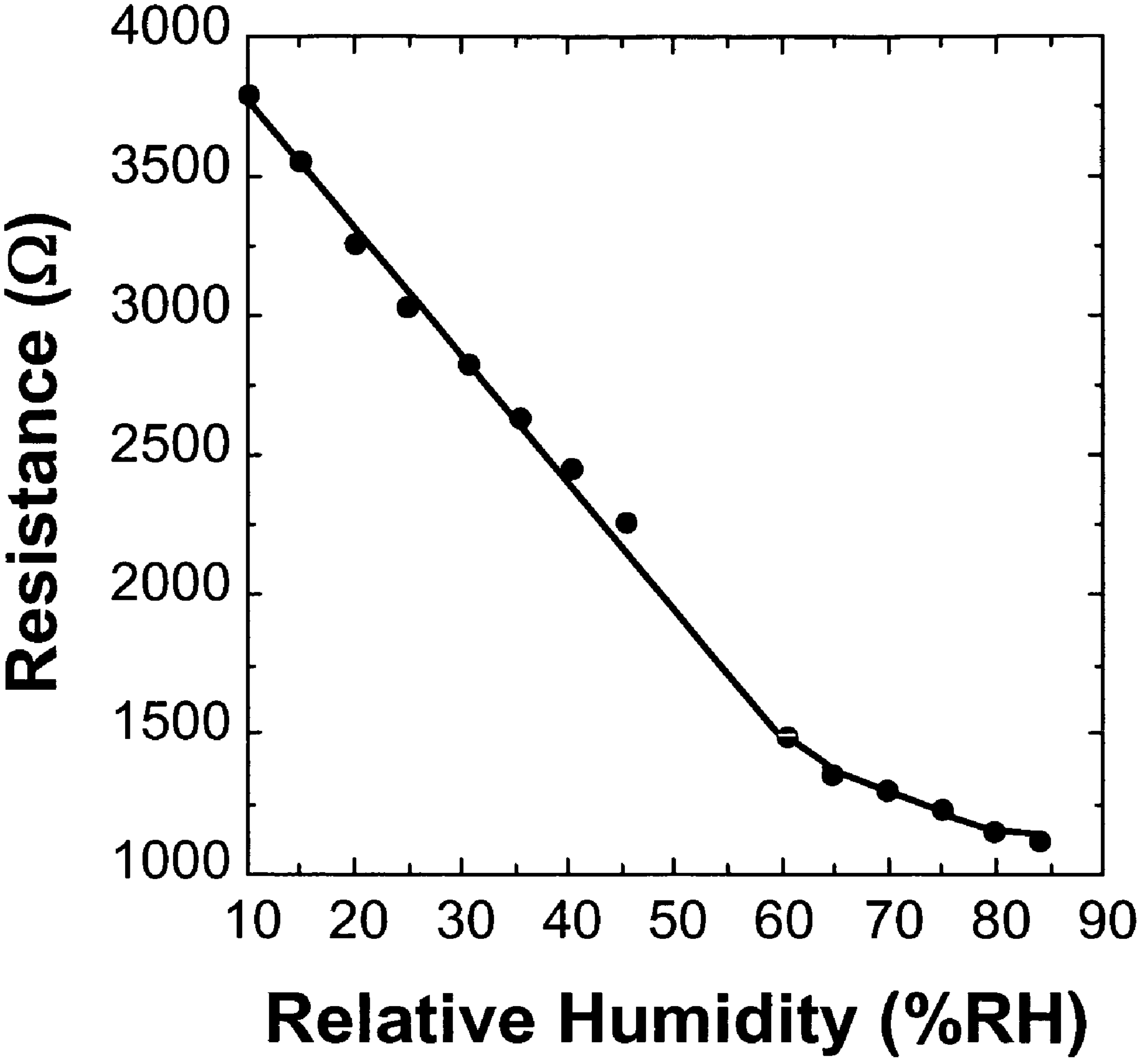
FIG. 3 is a graph of the resistance of a polyaniline fiber (length: 136.0 mm; diameter: 84 μm) as a function of percent relative humidity at room temperature (26.5° C.±0.5° C.).

B. Humidity Dependent Conductivity of Polyaniline Fibers:

The electrical conductivity of doped PANI changes with the humidity of the environment and other gas vapors. The humidity dependent conductivity change is not due to a chemical reaction, and is not a result of the degradation of the conducting polymers, but due to a change of the Fermi level of the polymer when an electron-donating or electron-withdrawing gas is absorbed to its surface. Therefore, such changes have a high degree of reversibility. FIG. 3 shows the resistance change of a polyaniline fiber (length: 136.0 mm, diameter: 84 μm) as a function of relative humidity at room temperature (26.5° C.±0.5° C.). Resistance measurements in FIG. 3 are taken when the change in resistance at a particular relative humidity is less than 1% (approximately at equilibrium).

If there is no dimensional change, the resistance of polyaniline fibers changes with both temperature and humidity. To decouple the data acquired from a sensor fabric, the conducting polymers are separated into two groups. One group is kept in a humidity controlled environment, so that the resistance changes only with temperature. The other group is exposed to ambient air, and the resistance changes both with temperature and humidity. By using a differential amplifier (either digital or analog), or a lookup table method, the temperature and humidity signals are decoupled and acquired.

Figure 4A:
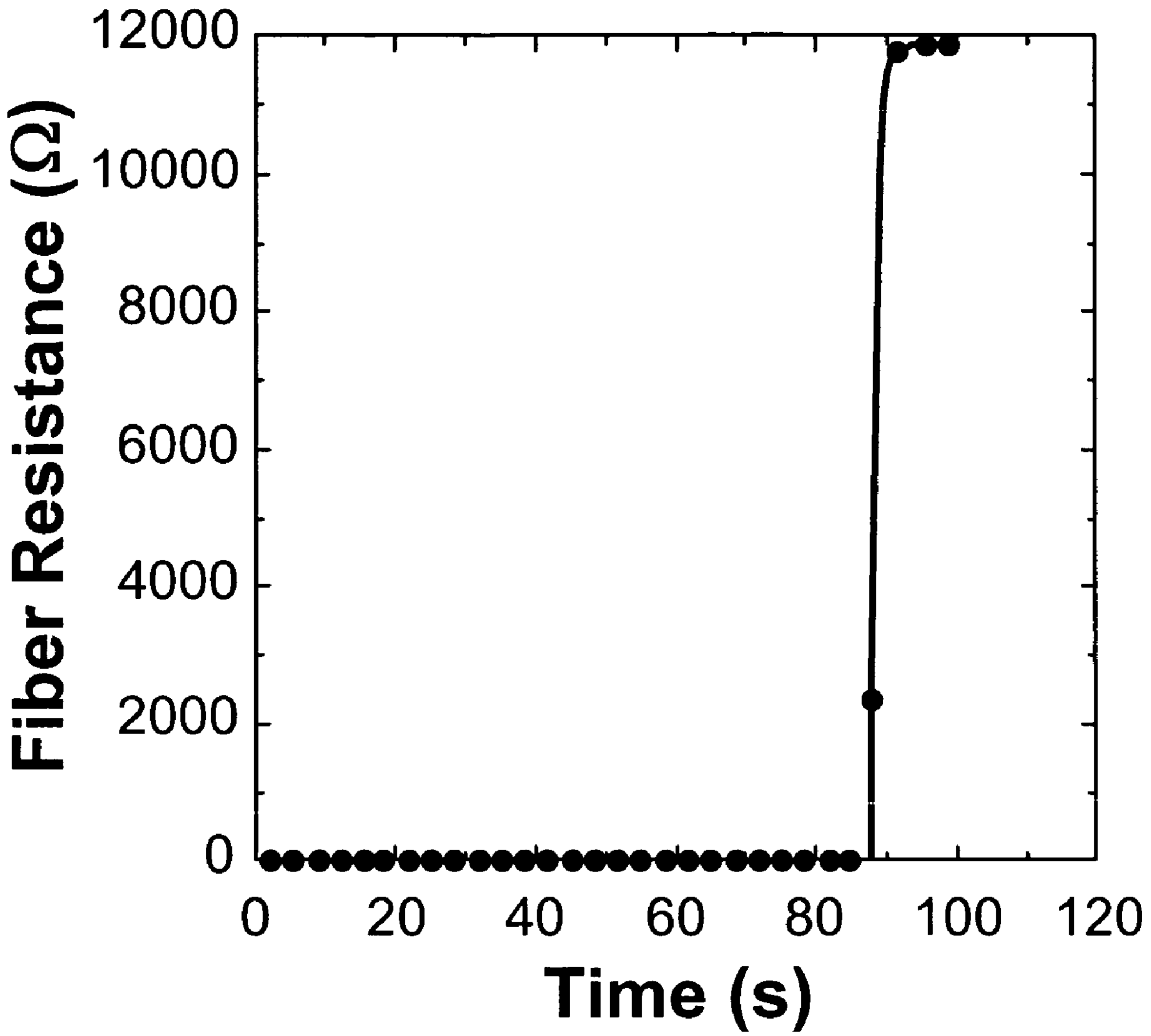
Figure 4B:
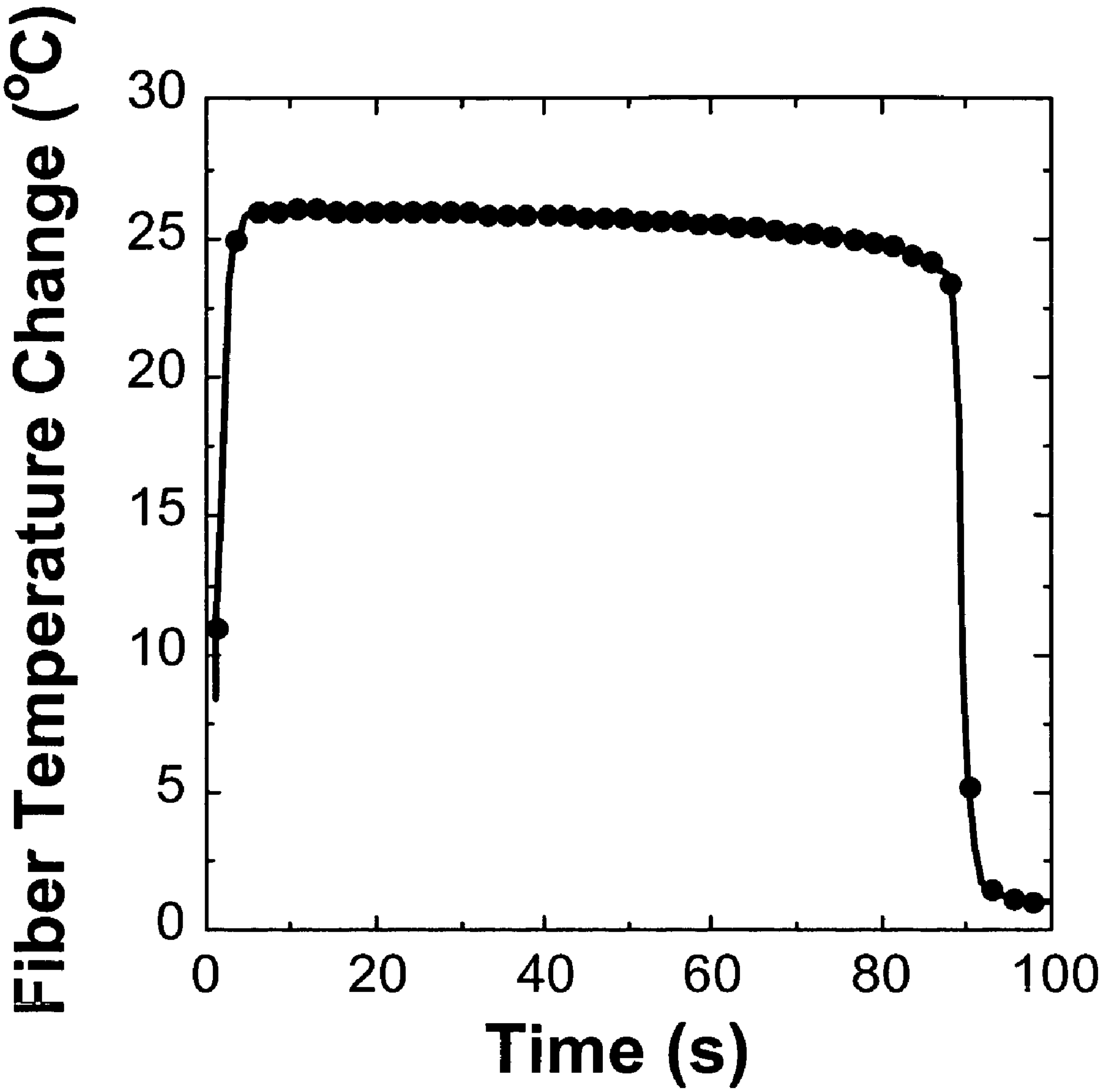
FIG. 4*b* is a graph of the temperature change as a function of time for this fiber, where the base temperature is 22.9° C.

C. Behavior of Polyaniline Fibers Under an Overloading Electrical Stimulus:

As can be seen from FIG. 2 hereof, the temperature of conducting polymer fibers increases when an electrical stimulus, either an applied voltage or current, is applied to the fiber as a result of resistive heating. Unlike most conductive wires, which melt when the applied current or voltage is excessive, the temperature at which polyaniline fibers lose their conductivity can be much lower than the thermal decomposition temperature of the fiber. FIG. 4*a* is a graph of the resistance as a function of time for a 4.5 V voltage applied to a polyaniline fiber (PANI.$AMPSA_{0.2}$. $DCAA_{0.27}$.$(H_3PO_4)_{0.35}$, where each of these numbers corresponds to the number of acid molecules per nitrogen atom on the polyaniline backbone) having a length of 12.0 mm and a diameter 95 μm, while FIG. 4*b* is a graph of the temperature change as a function of time for this fiber. The base temperature of the fiber was 22.9° C. The temperature at which the conductivity of the fiber is destroyed is seen to be about 47.9° C., which is much lower than its thermal decomposition temperature (180° C.) for this fiber. As stated hereinabove, typically, the decomposition temperature of conducting polyaniline fibers depends on the dopant employed, and ranges between about 120 and 250° C. For example, HCl-doped polyaniline fibers decompose at around 120° C., those doped with phosphoric acid decompose at about 250° C., and those doped with sulfonic acids generally decompose at approximately 200° C. The fiber resistance at 47.9° C. should be 29.5 Ω.

Figure 5:
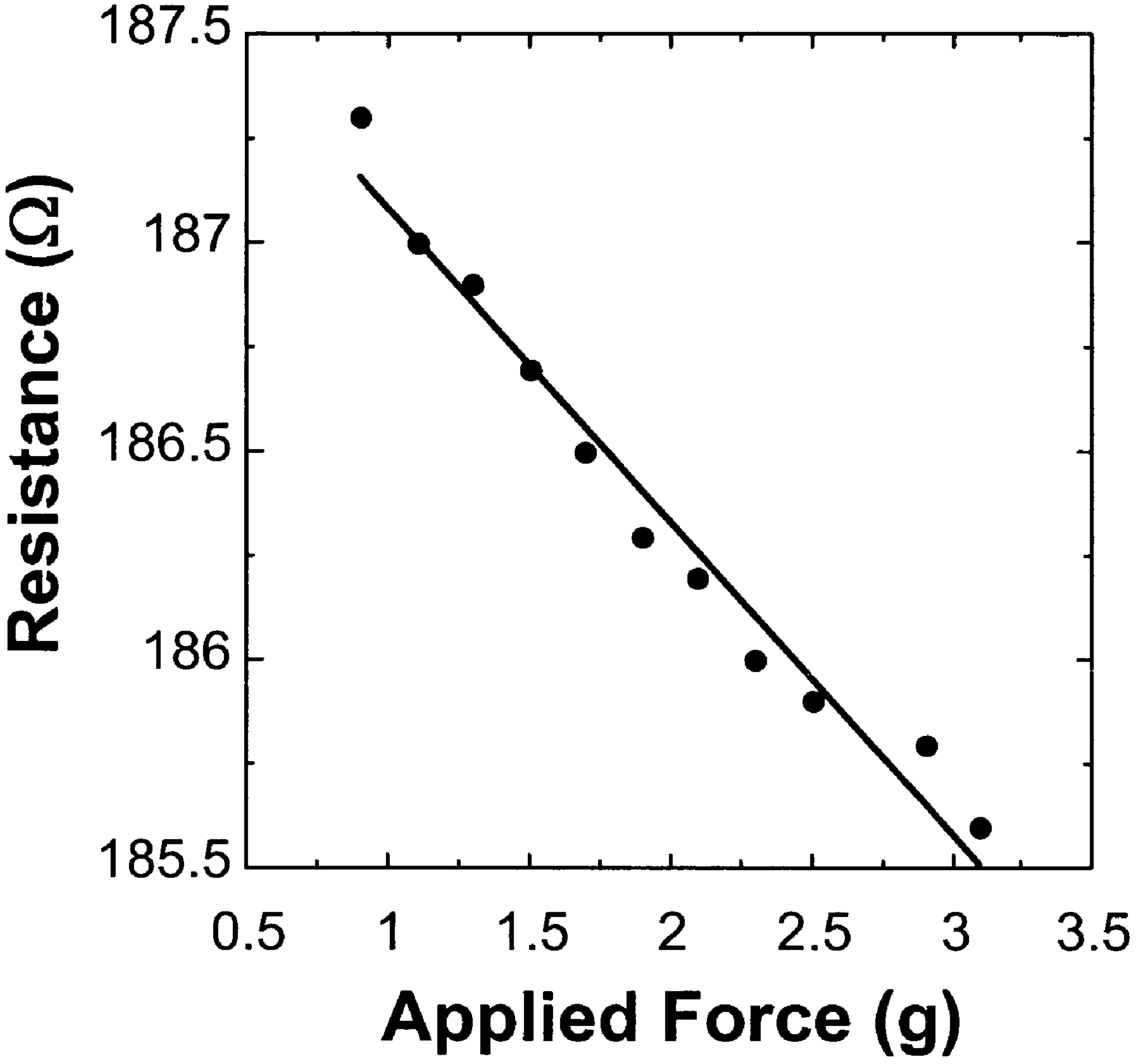
FIG. 5 is a graph of the resistance of a polyaniline fiber as a function of applied force for a polyaniline fiber having a diameter of 118 μm and a length of 60 mm; the temperature was 24.2° C., and the relative humidity was 20%.

D. Conductivity of Polyaniline Fibers as a Function of Linear Extension:

FIG. 5 is a graph of the change of resistance of a polyaniline fiber as a function of applied force for a fiber having a diameter of 118 μm and a length of 60 mm; the temperature was 24.2° C., and the relative humidity was 20% RH. As shown in FIG. 6*a*, the 40 denier polyaniline monofilament (dark fibers) are knitted into a fabric with Nylon yarn (light fibers).

Figure 7A:
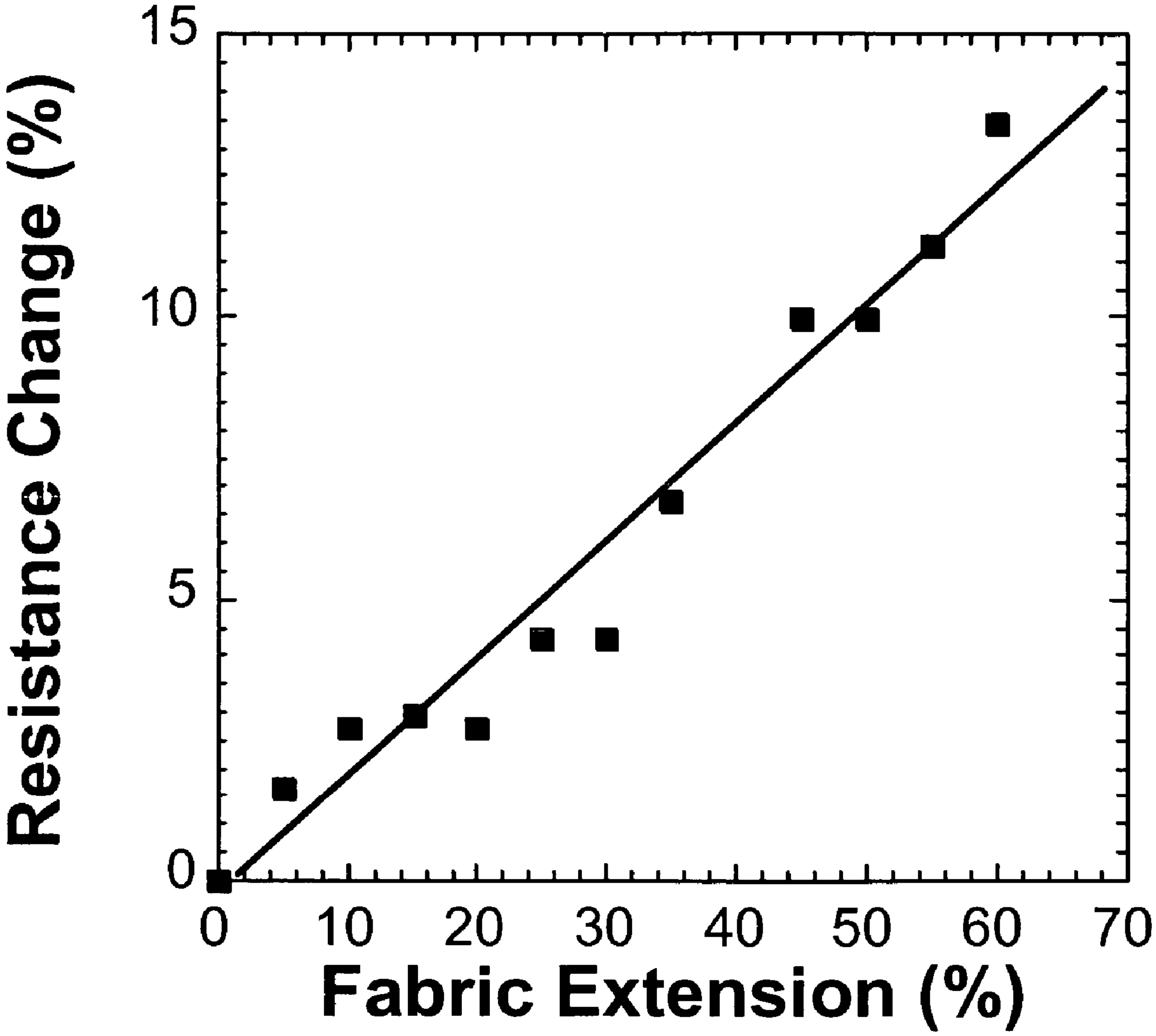
Figure 7B:
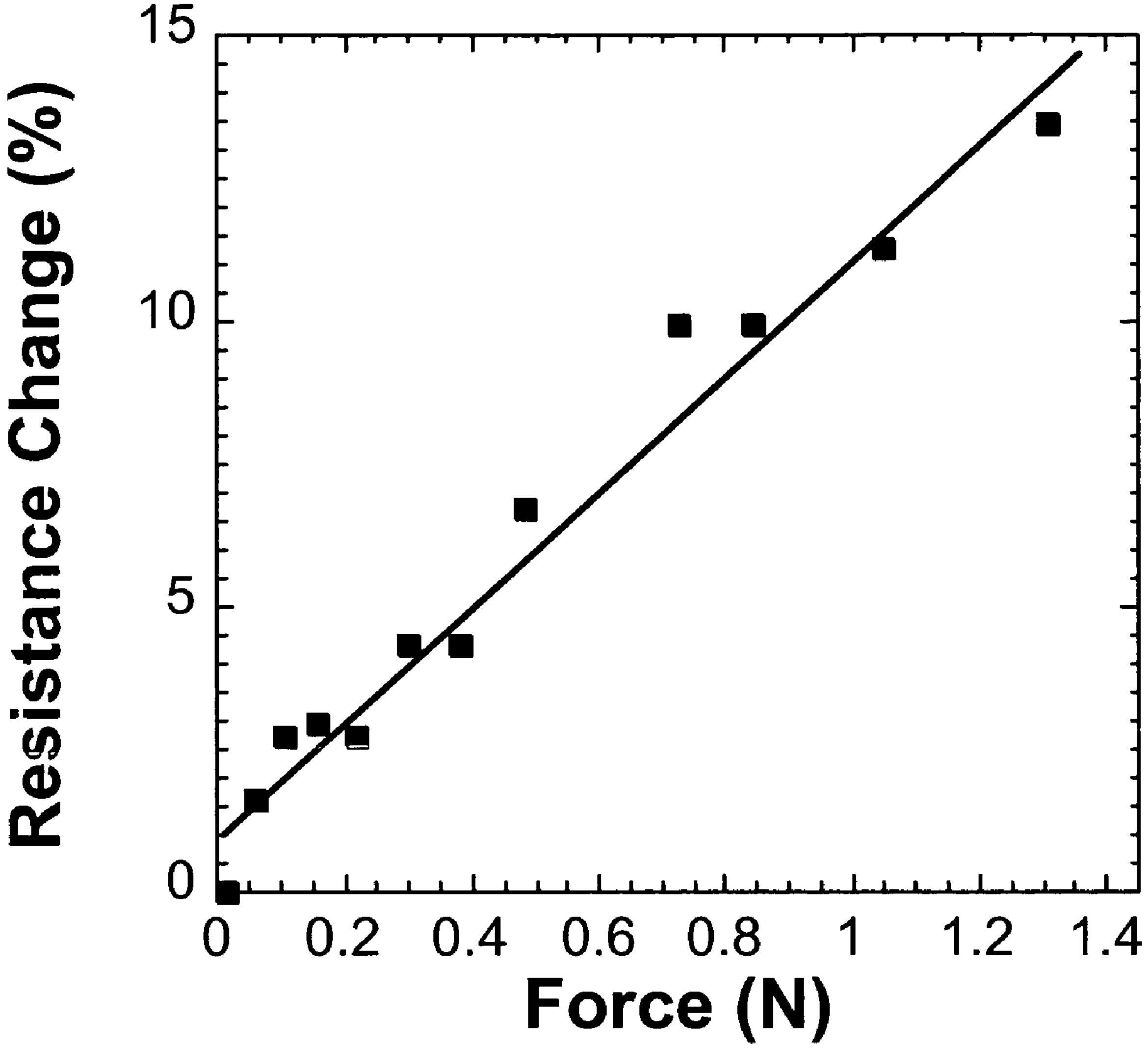
FIG. 7*b* shows the percent change of resistance thereof as a function of applied force (N).

FIG. 7*a* shows the percent change of resistance of the polyaniline monofilament knitted into the fabric shown in FIG. 6 hereof as a function of the percent extension of the fabric, while FIG. 7*b* shows the percent change of resistance thereof as a function of applied force (N). Hence, the conducting polymer fiber in the knitted fabric can monitor both the amount of applied load (stress) as well as geometric displacement (strain) of the fabric.

Having generally described the invention, the following EXAMPLES provide further detail.

EXAMPLE 1

Figure 8A:
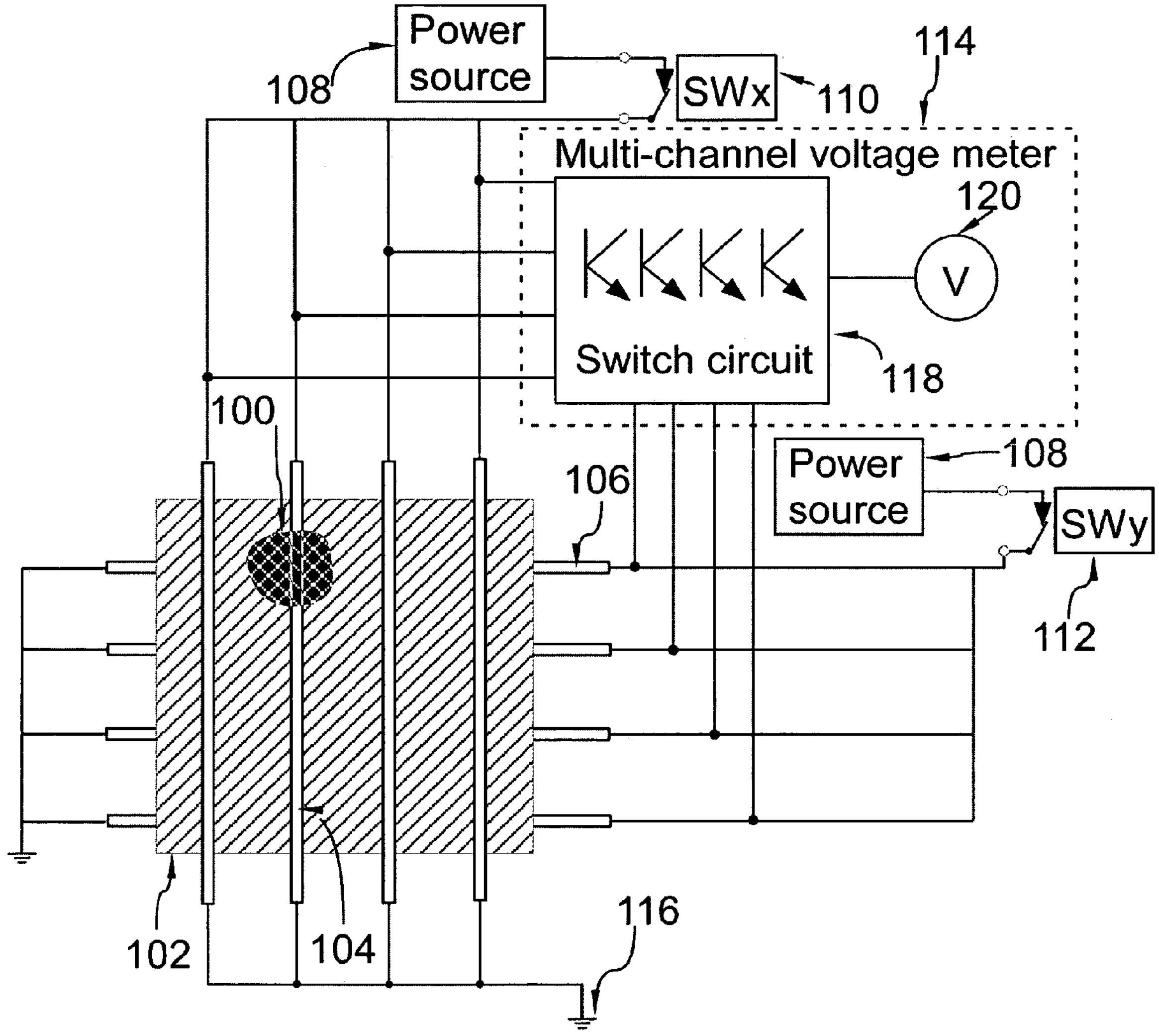
FIG. 8*a* shows a schematic representation of an apparatus for detecting the presence of an electrolyte, such as blood, and its location on a fabric made in accordance with the teachings of the present invention, while simultaneously resistively heating a wearer of the fabric.

Location of Blood Emission From a Wound and Resistive Heating:

In a grid of conductive fibers shown in FIG. 8*a*, where a first plurality of substantially parallel fibers (shown as vertical fibers in FIG. 8*a*) is separated from a second plurality of substantially parallel fibers oriented approximately perpendicularly (shown as horizontal fibers in FIG. 8*a*) to the first set of fibers using an insulator fabric layer 102, if a conducting liquid, 100, say, a drop of blood is absorbed by insulating layer 102 near the intersection of conducting polymer fibers; for example, near the intersection of fiber, 104, and fiber, 106, respectively, the electrical insulation between the two fibers will change significantly. By measuring electrical signals resulting from the change in the conductivity of the fibers, the position of the electrolyte can be determined.

Figure 8B:
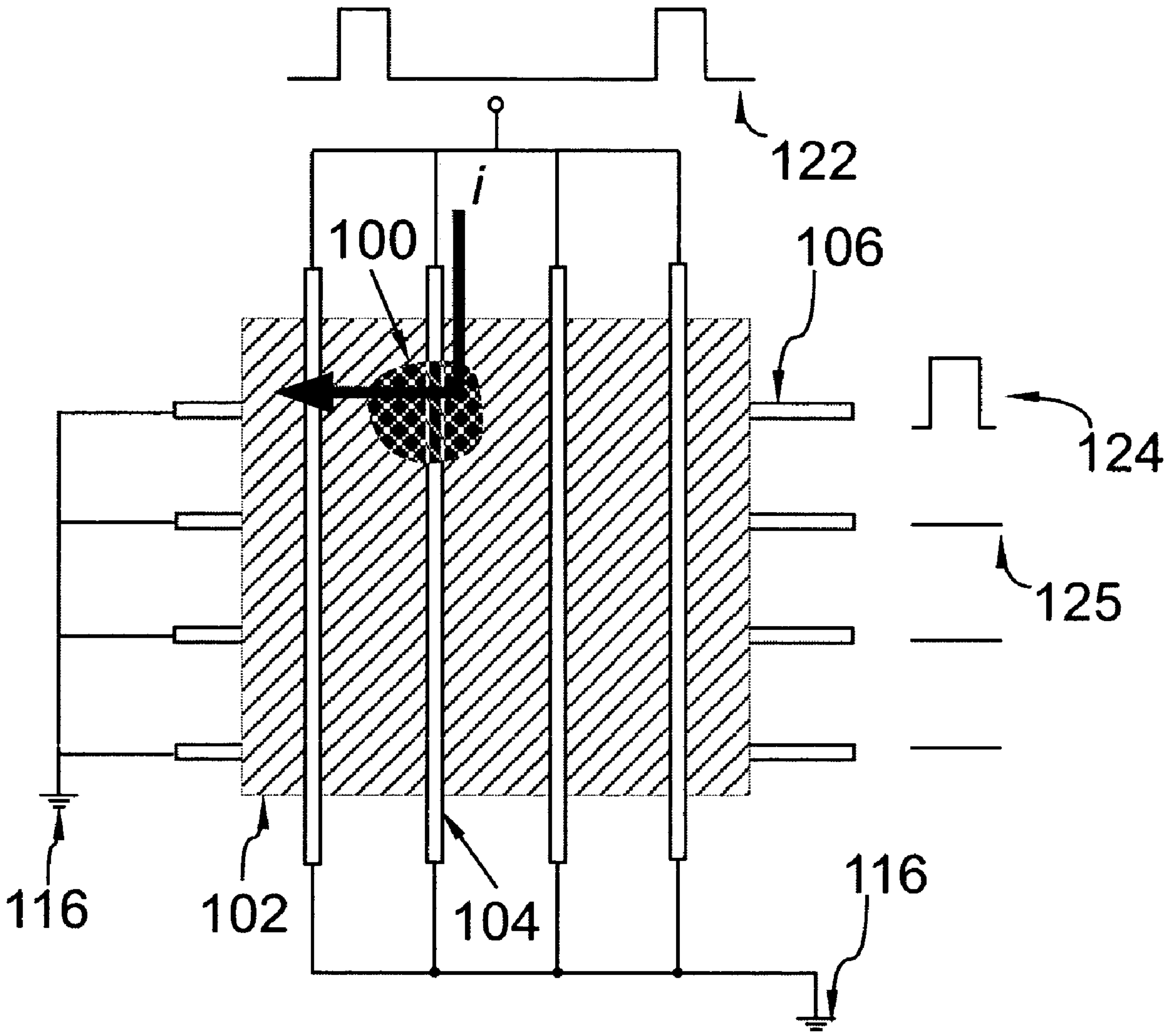
FIG. 8*b* shows signals observed on a set of substantially parallel fibers when a voltage stimulus is applied to a second set of substantially parallel fibers perpendicular thereto.
Figure 8C:
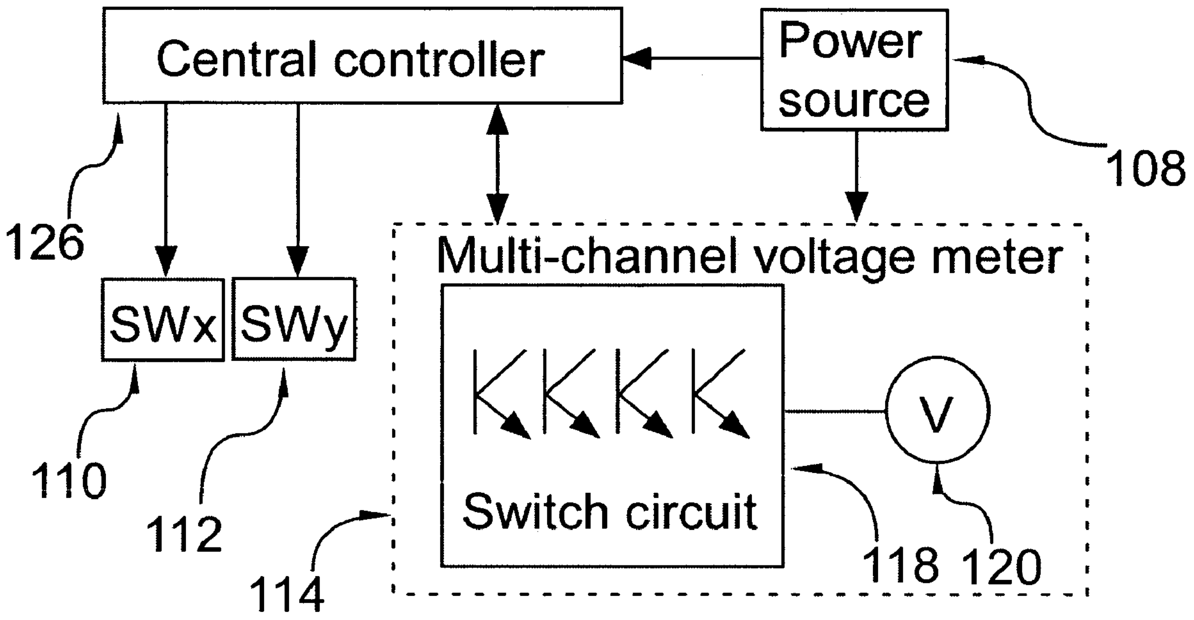
FIG. 8*c* shows a block diagram of the control module for the apparatus shown in FIG. 8*a*.

Voltage from power source, 108, is connected to the two sets of parallel fibers by means of switch $SW_x$, 110, and $SW_y$, 112, respectively. The voltage on the fibers is measured using volt measuring device, 120, through switch circuit, 118, using a scanning method; one fiber at a time. If Pulse Width Modulation (PWM) signal, 122, is introduced onto the first set of parallel fibers (See, FIG. 8*b*), when the voltage on the second set of parallel wires is measured, as a result of the electrolyte present at the intersection of fibers 104 and 106, a voltage pulse will be observed. Such a signal indicates that there is electrolyte present on fiber 106. When a similar PWM signal is applied to the second set of parallel fibers, a voltage pulse will appear on the first set of fibers on fiber 104, which means that electrolyte is present on that fiber. Combining these two pieces of information, the position of the electrolyte is obtained. The PWM signals can also be used to control the temperature of the dual purpose fabric through resistive heating. The sampling rate of the fabric fibers determines the minimum duty cycle and the highest repeat frequency of the PWM, the highest achievable duty cycle being 50%, since the two sets of fibers cannot be stimulated simultaneously. Signals in the fabric are controlled and acquired by a control module, the block diagram of which is depicted in FIG. 8*c*. In the control module, power source 108, multichannel voltage measuring device, 114, consisting of switch circuit, 118, voltage measuring device, 120, and switches $SW_x$ (110) and $SW_y$ (112) are controlled by microprocessor-based central controller, 126.

EXAMPLE 2

Breathing Sensor Fabric:

The woven fabric shown in FIGS. 6*a* and 6*b* can also be used to sense breathing rate, since breathing is a continuously repeating movement, and the frequency and amplitude of resistance change caused by breathing are significantly different from that affected by the temperature and humidity. Therefore, decoupling can readily be achieved.

EXAMPLE 3

Figure 9A:
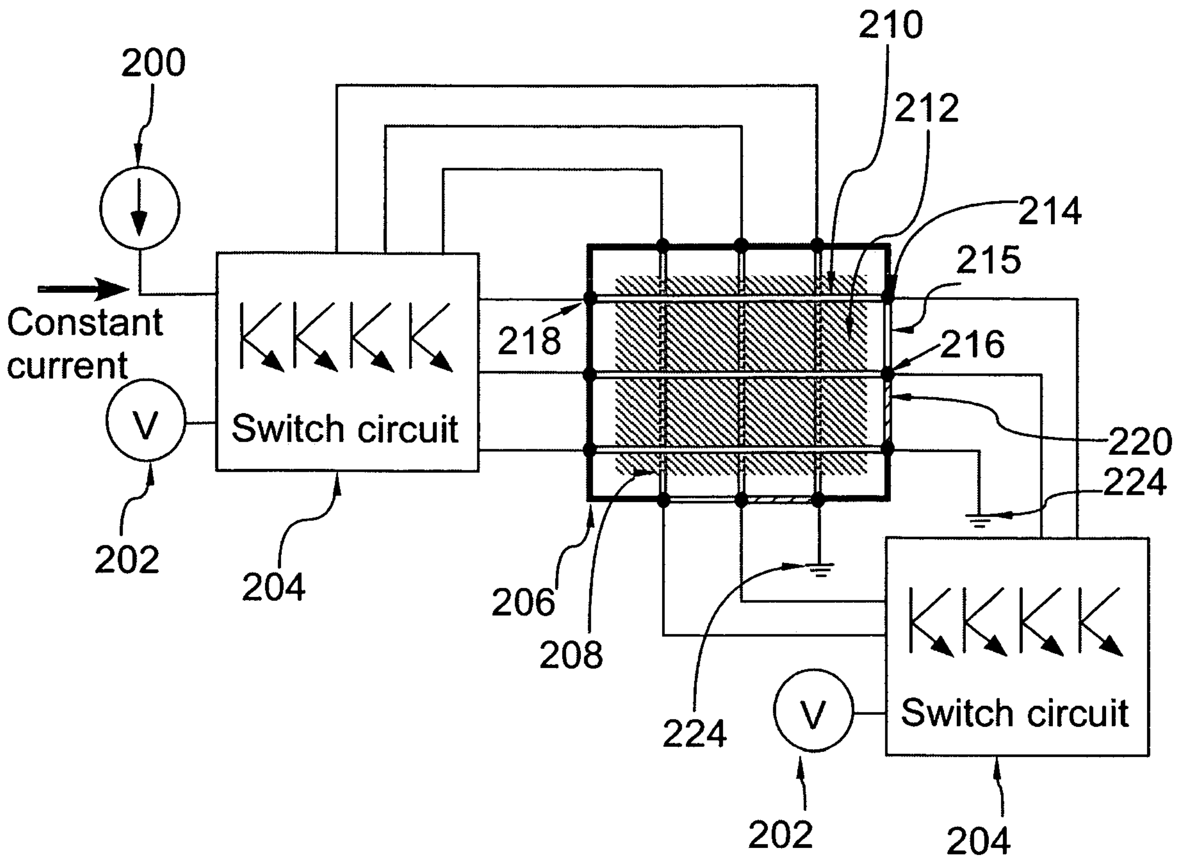
Figure 9B:
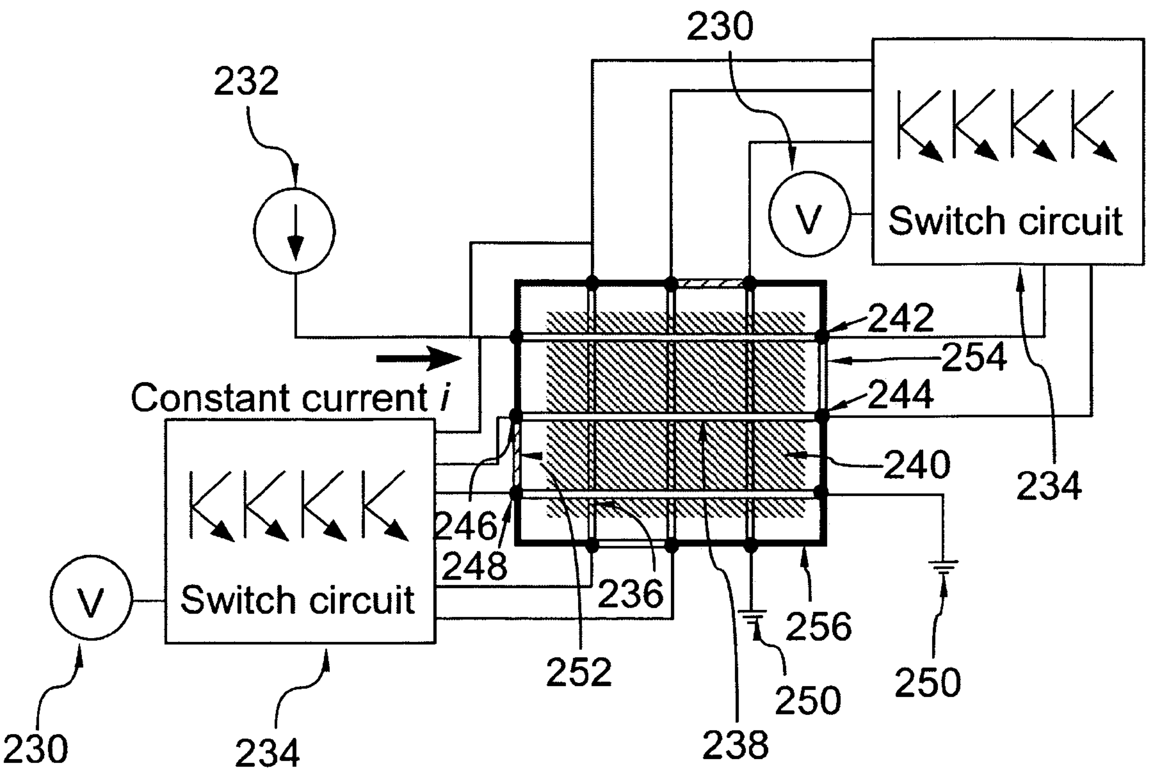
Figure 9B:
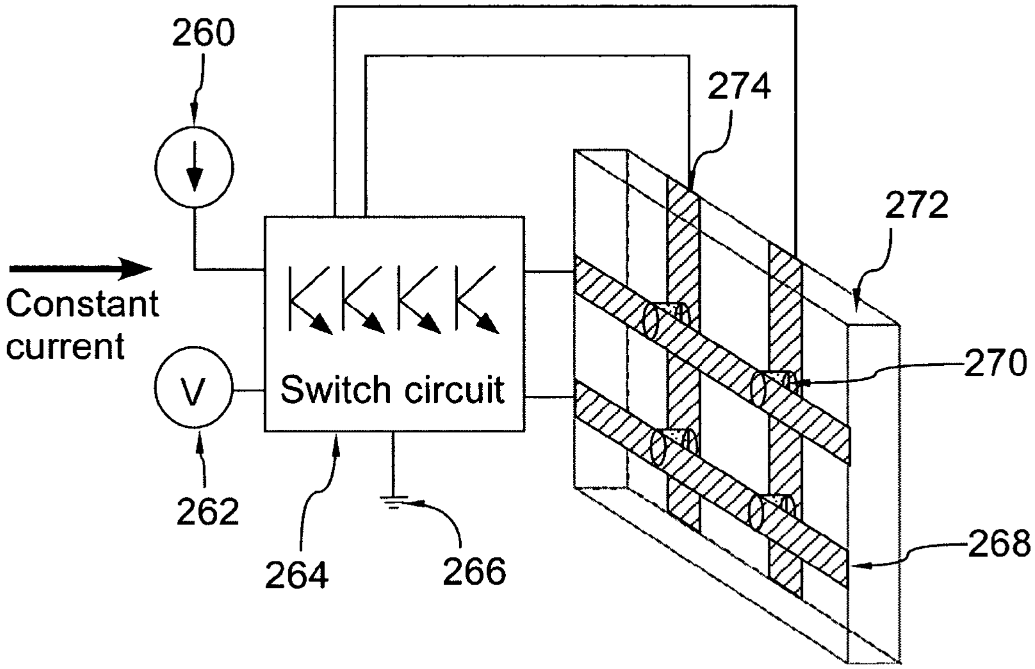
Figure 9C:
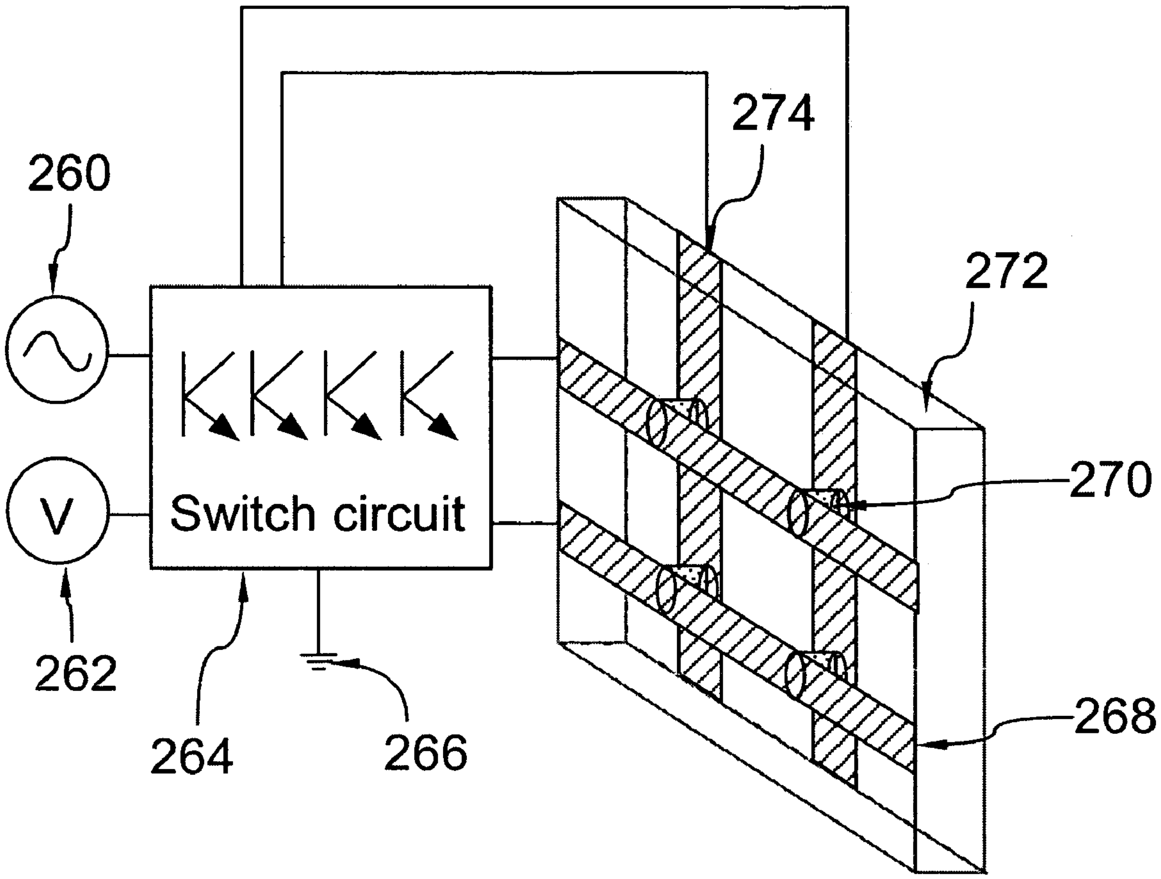

Shape Sensor Fabrics:

As stated hereinabove, resistance of the polyaniline fibers varies with the application of a force to the fiber which gives rise to a dimensional change along its length (See, FIGS. 7*a* and 7*b* hereof). Based on this characteristic, shape/stress sensors can be made using polyaniline fibers. FIGS. 9*a* to 9*c* show three types of shape sensors. In FIG. 9*a*, a first set of parallel conducting polymer fibers, fiber, 208, as an example are attached to frame, 206, and a second set of parallel fibers, fiber, 210, as an example, the two sets of parallel fibers being electrically isolated by isolation layer, 212. For either the first set or the second set of parallel fibers, two pieces of conducting polymer fiber, one exposed to air, 215, and the other coated, 220, are immobilized on frame 206 and electrically connected to fiber 210 in the second set of fibers, as an example, for temperature and humidity sensing. As shown, fiber 215 is connected to fiber 210 at point 214, and fiber 220 is connected to fiber 215 at point 216. Resistance of the 3 polyaniline fibers is measured by applying a constant current from current source, 200, through switch circuit, 204, and the voltages measured one at a time by voltage measuring device,

202, through switch circuit 204 using a scanning method at points 214, 216 and 218. The voltage at point 216 only changes with the temperature, while that between 214 and 216 changes with temperature and humidity. The voltage between 218 and 216 is affected by the temperature, humidity and the stress on fiber 210. Accordingly, by using differential amplifiers (not shown in the figure) or differential or lookup table algorithms (employed by a microprocessor), the humidity, temperature and shape change on fiber 210 can be obtained. The change of shape of the wires within the frame can be monitored by scanning the fiber matrix.

FIG. 9*b* shows another type of sensor. Here the first set of parallel fibers and the second set of parallel fibers are composed of single fibers. One end of each fiber is grounded, while the other end is connected to a constant current source, 232. Resistance of the sensing pieces is acquired by dividing the voltage difference by the current i, and the voltages are measured by voltmeter 230 through switch 234 at electrical contacts 242, 244, 246, and 248 using a scanning method. Resistances of the fibers fixed on the frame, for example 252 and 254, are used to decouple the effects of temperature and humidity by differential amplifiers (not shown in the figure) or microprocessors (using differential or lookup table algorithms). Compared to that shown in FIG. 9*a*, the sensor shown in FIG. 9*b* has the current source connected directly to one end of the fibers and, therefore, the switch circuit is simplified. However, as shown in FIG. 9*b*, any broken fiber piece will cause the failure of the entire device. Thus, the reliability of this sensor is not as good as that for the device illustrated in FIG. 9*a*.

Figure 9D:
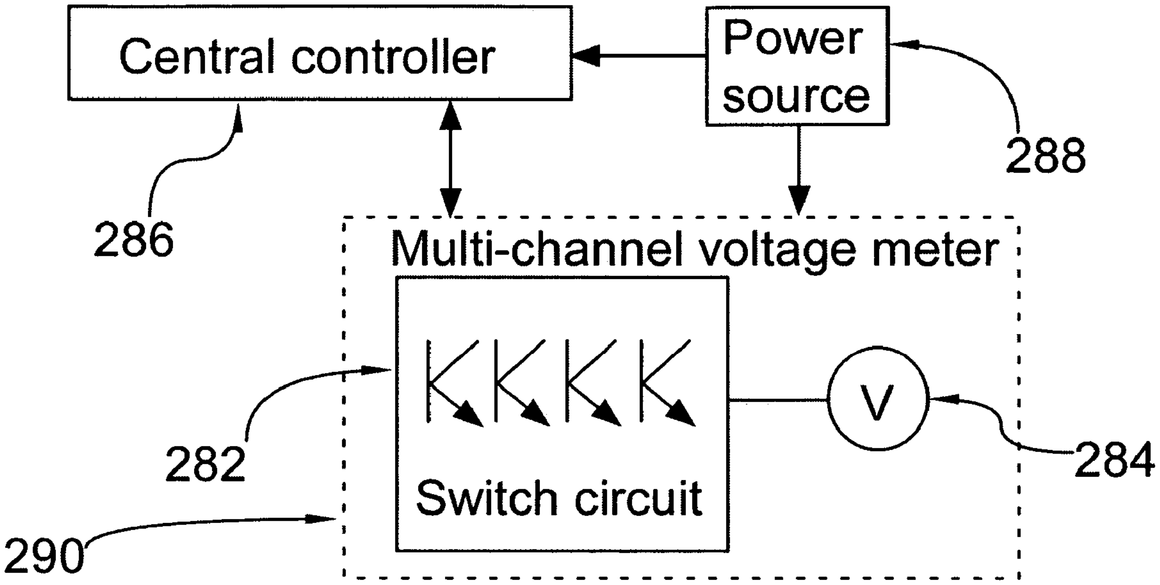
FIG. 9*d* shows a block diagram of the control module therefor.

For the sensors shown in FIG. 9*a* and FIG. 9*b*, the force can only be applied in one direction. In FIG. 9*c*, the 3-D shape sensor, on which the force can be applied in three dimensions is schematically shown. In this sensor, conducting polymer fibers, for example 270 can be inserted on an elastic body 272 to form a 3-D shape sensor, which is used to sense the shape change in 3-D space. In FIG. 9*c*, the second set of parallel conductive coating lines, for example 268, and the first set of parallel coating lines, for example, 274, are connected with a switch circuit, 264, and the resistances of the conducting polymer fibers are measured using a scanning method by applying constant current from a current source, 260, and measuring the voltage by using voltmeter, 262. Since the conducting polymer fibers are sealed in the elastic body, humidity change will have little effect on the resistance of the fibers. Effects of temperature can be compensated in data processing, and an extra temperature sensor is needed. The scanning process is controlled by a control module (FIG. 9*d*), which is also used for acquiring the signals, and data processing. In the control module, a microprocessor-based central computer, 286, is used to control the multi-channel, 290, that consists of a switch circuit, 282, and a voltage meter, 284.

EXAMPLE 4

Figure 10A:
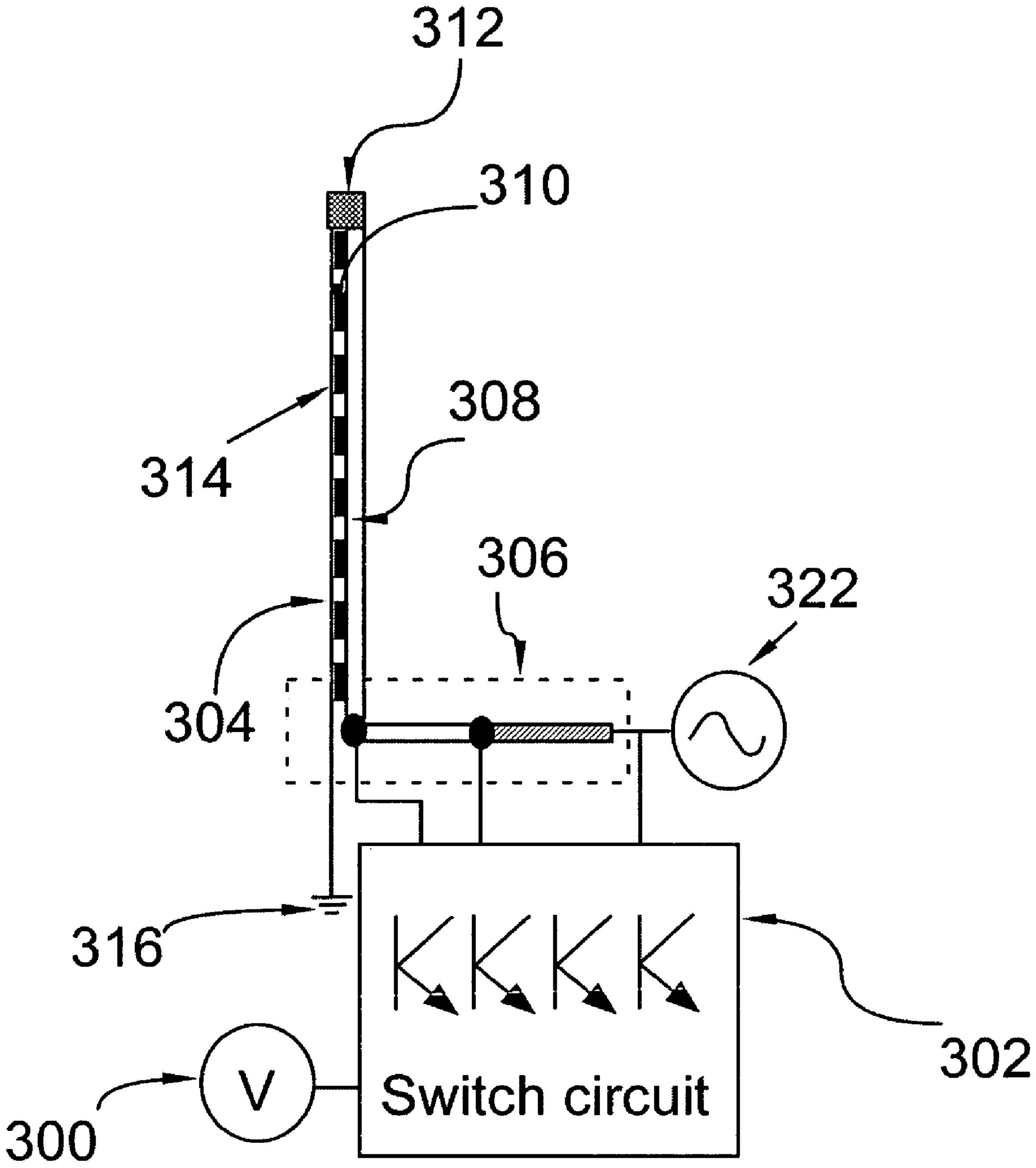
Figure 10B:
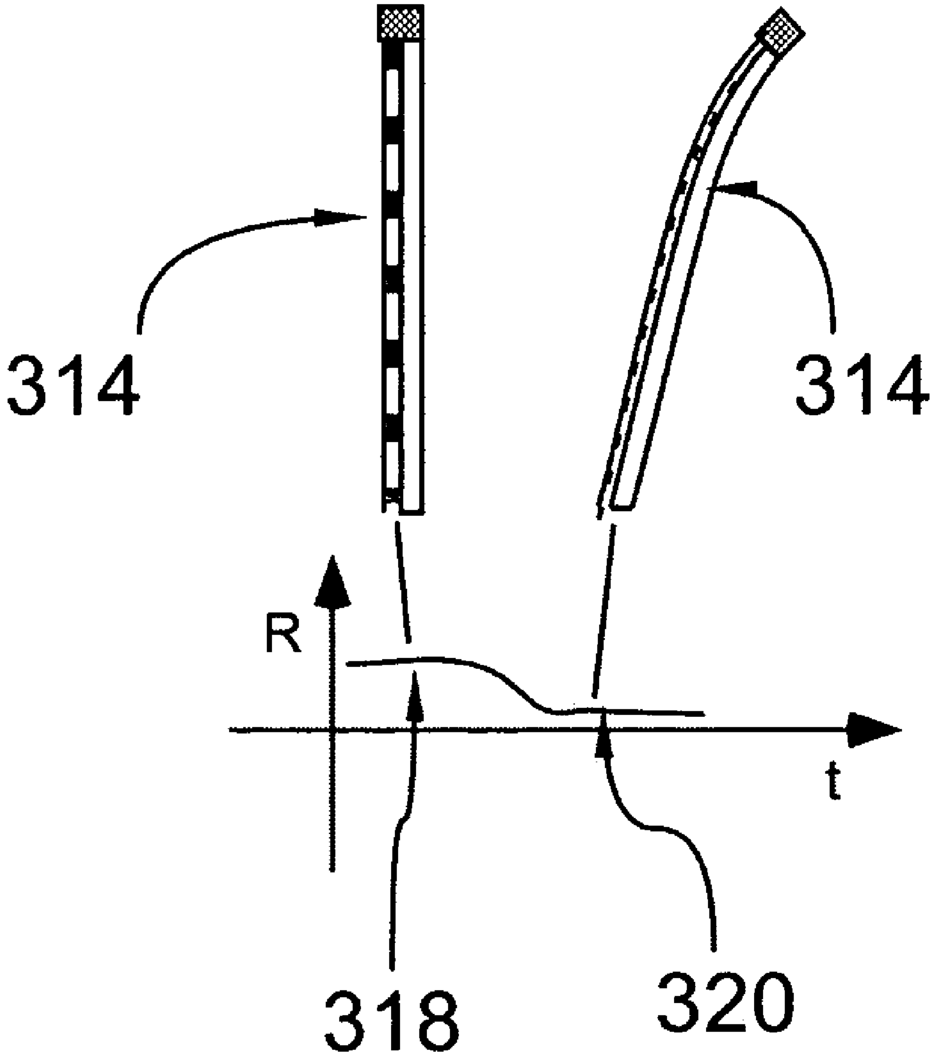
FIG. 10*b* shows a graph of the resistance of the sensor as a function of sensor bending.

Touch Sensor:

FIG. 10*a* is a schematic representation of a polyaniline touch sensor, 314, which includes a polyaniline fiber, 308, and a metal wire coated with varnish, 304. Varnish, 310, is used to attach the metal wire to the polyaniline fiber. The top of the metal wire is placed in electrical connection with the polyaniline fiber using silver conducting paint, 312. When the sensor is touched it will bend, 314, and the polyaniline fiber is extended. By monitoring the resistance change schematically shown in FIG. 10*b*, for example, between 318 and 320, knowledge that the device has been touched or has touched something is obtained. This type of sensor has been made with a diameter of between 50 and 200 μm, and therefore, by using a spectrum division approach, the touch sensor can be used as a probe to measure the geometry of sub-millimeter structures in a number of manufacturing areas, including optical fibers, automotive (fuel injectors), and electronics (microwave attenuation standards), in which the optical methods have unsolved problems with diffraction.

By adding two pieces of fiber, one is coated only for temperature sensing, 326, and the other one is exposed to air for temperature and humidity sensing, 324, on a fixed frame, the touch sensor can also be used for temperature and humidity sensing and therefore, by using differential amplifiers (not shown in the figure) or differential of lookup table algorithms (employed by a microprocessor), it can be used in an environment in that the temperature and humidity change. Resistance of the sensing pieces is measured by applying a constant current from a constant current source, 322, and then voltages on the coated fiber piece on frame, 326, the exposed fiber piece on frame, 324, and the touch sensor piece, 314, are measured by the voltage meter 300 through switch circuit 302.

EXAMPLE 5

Figure 11:
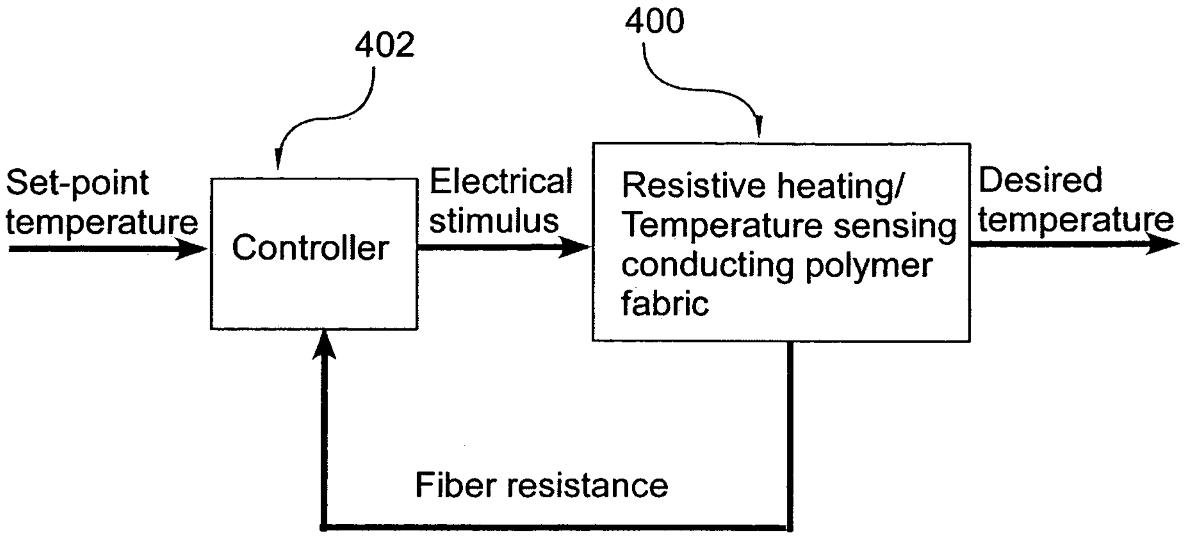
FIG. 11 shows a schematic representation of an embodiment of the present invention showing a conducting polymer heating element capable of generating heat when current is passed therethrough, the resistivity of the heating element varying with temperature such that from the measurement of the resistivity of the element and the adjustment of the applied current or voltage, a chosen temperature can be maintained.

Multifunction Conducting Polymer Devices:

FIG. 11 shows a schematic representation of a conducting polymer heating element, 400, capable of generating heat when current is passed therethrough, the resistivity of the heating element varying with temperature such that from the measurement of the resistivity of the element and adjustment of the applied current, a chosen temperature can be maintained. Also in FIG. 11, a single controller, 402, is shown for providing both the temperature sensing and the voltage generation functions. Differential algorithms or lookup table methods can be used by the controller for temperature sensing.

Different from other resistive heating devices that use a separate temperature sensor (e.g. a thermocouple or a thermistor) for temperature feedback, the present multifunctional devices monitor the temperature of the heating element by measuring its resistance change. In addition, as illustrated in FIG. 11, from room temperature to about 100° C., the conductivity change of the polyaniline fibers is significant (>30%). Accordingly, a simple resistance measuring device other than high precision devices, which are needed to measure the resistance change of some metal wires such as copper or aluminum due to the tiny conductivity change in this temperature range, can be used for monitoring the temperature. The multifunctional feature of the polyaniline fibers—as a resistive temperature device, and a wire that can conduct a large current enables the compact and economical resistive heating fabric. Other multifunction devices can also be envisioned using conducting polymer fibers and fabrics. As an example, humidity control in a chamber can be achieved by supplying current to a conducting polymer fiber onto which water is absorbed, where the current is controlled by a feedback system which receives resistance measurements from the fiber which are responsive to the relative humidity to which the fiber is exposed.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for measuring relative humidity, comprising in combination:

(a) at least one first conducting polymer fiber;

(b) means for measuring the electrical resistance of said at least one first conducting polymer fiber, whereby the relative humidity is determined;

(c) at least one second conducting polymer fiber, said second conducting polymer fiber being isolated from changes in humidity;

(d) means for measuring the resistance of said at least one second polymer fiber, whereby the temperature of said at least one second polymer fiber is determined; and (e) means for correcting said relative humidity for variations in temperature.

2. The apparatus as described in claim 1, wherein said at least one first conducting polymer and said at least one second conducting polymer comprise polyaniline.

3. The apparatus as described in claim 2, wherein said at least one polyaniline fiber is woven, knitted, stitched, or braided into a fabric comprising non-conducting fibers.

4. Apparatus for providing humidity, comprising in combination:

(a) at least one conducting polymer fiber consisting of polyaniline;

(b) means for applying electric current to said at least one conducting polymer fiber effective for controlling the amount of water absorbed thereon; and (c) means for measuring the resistance of said at least one polymer fiber, such that the relative humidity to which said fiber is exposed can be determined.

5. The apparatus as described in claim 4, further comprising feedback means for controlling said electric current applying means in response to the resistance measured by said resistance measuring means, whereby the relative humidity to which said conducting polymer fiber is exposed is maintained at a chosen value.

6. The apparatus as described in claim 4, wherein said polyaniline fiber is woven, knitted, stitched, or braided into a fabric comprising non-conducting fibers.

7. A method for providing humidity, comprising the steps of:

(a) applying electric current to at least one conducting polymer fiber consisting of polyaniline effective for controlling the amount of water absorbed thereon; and (b) measuring the resistance of the at least one polymer fiber, such that the relative humidity to which the fiber is exposed can be determined.

8. The method as described in claim 7, further comprising the step of controlling the electric current in response to the resistance measured in said step of resistance measuring, whereby the relative humidity to which the conducting polymer fiber is exposed is maintained at a chosen value.

9. The method as described in claim 7, wherein the polyaniline fiber is woven, knitted, stitched, or braided into a fabric comprising non-conducting fibers.

* * * * *